US012635338B2

(12) United States Patent
Jang et al.

(10) Patent No.:  US 12,635,338 B2
(45) Date of Patent:  May 19, 2026

(54) DISPLAY DEVICE

(71) Applicant: Samsung Display Co., LTD., Yongin-si (KR)

(72) Inventors: Yun Jang, Yongin-si (KR); Suk Hoon Kang, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 464 days.

(21) Appl. No.: 18/109,422

(22) Filed: Feb. 14, 2023

(65) Prior Publication Data

US 2023/0403878 A1    Dec. 14, 2023

(30) Foreign Application Priority Data

Jun. 13, 2022    (KR) ........................ 10-2022-0071652

(51) Int. Cl.
H10K 59/80        (2023.01)
H10K 59/121       (2023.01)
H10K 59/38        (2023.01)

(52) U.S. Cl.
CPC ......... H10K 59/1213 (2023.02); H10K 59/38 (2023.02); H10K 59/877 (2023.02); H10K 59/878 (2023.02)

(58) Field of Classification Search
CPC ...... H10K 59/38; H10K 59/878; H10K 59/40; G02F 1/133516; C25D 13/00; C25D 13/05; C25D 13/12; C25D 13/18; H01L 2224/95133; G06F 3/0445; G06F 3/0446; G06F 3/0412; G06F 2203/04111; B03C 5/005; B03C 5/026
See application file for complete search history.

(56) References Cited

U.S. PATENT DOCUMENTS

| | | | |
|---|---|---|---|
| 8,684,546 | B2 | 4/2014 | Ninan |
| 9,247,613 | B2 | 1/2016 | Yang et al. |
| 9,720,149 | B2 | 8/2017 | Wu et al. |
| 9,989,806 | B2 | 6/2018 | Lee et al. |
| 10,008,645 | B2 | 6/2018 | Bonar et al. |

(Continued)

FOREIGN PATENT DOCUMENTS

| | | |
|---|---|---|
| CN | 102563545 | 7/2012 |
| CN | 103227189 | 7/2013 |

(Continued)

OTHER PUBLICATIONS

Chan-mo Kang et al., "Recent progress of organic light-emitting diode microdisplays for augmented reality/virtual reality applications", Journal of Information Display, May 2, 2021, pp. 19-32, vol. 23, No. 1.

(Continued)

*Primary Examiner* — Alia Sabur
(74) *Attorney, Agent, or Firm* — CANTOR COLBURN LLP

(57) ABSTRACT

A display device includes first control electrodes on a light emitting element layer, second control electrodes on the first control electrodes, and a color conversion layer in the light emitting element layer. A first space is disposed between the first control electrodes, a second space is disposed between the second control electrodes, and the color conversion layer is disposed at an intersection where the first space and the second space intersect.

27 Claims, 17 Drawing Sheets

(56)                References Cited

U.S. PATENT DOCUMENTS

| | | | |
|---|---|---|---|
| 10,090,367 B2 | 10/2018 | Choi et al. | |
| 10,241,360 B2 | 3/2019 | Chu et al. | |
| 10,297,581 B2 | 5/2019 | Steckel et al. | |
| 10,365,509 B2 | 7/2019 | Jeon et al. | |
| 10,373,978 B2 | 8/2019 | Lee et al. | |
| 10,606,112 B2 | 3/2020 | Jeon et al. | |
| 10,692,417 B2 | 6/2020 | Lee et al. | |
| 10,884,560 B2 | 1/2021 | Pan | |
| 11,018,323 B2 | 5/2021 | Lee et al. | |
| 11,362,149 B2 | 6/2022 | Yan et al. | |
| 2015/0285969 A1* | 10/2015 | Kim | G02B 5/201 |
| | | | 359/891 |
| 2016/0209706 A1 | 7/2016 | Miki et al. | |
| 2018/0045866 A1* | 2/2018 | Chae | G02F 1/133553 |
| 2018/0182819 A1* | 6/2018 | Jo | H10K 50/865 |
| 2018/0210282 A1* | 7/2018 | Song | G02B 5/22 |
| 2021/0109617 A1* | 4/2021 | Lin | H10D 86/40 |
| 2021/0351369 A1 | 11/2021 | Peng | |

FOREIGN PATENT DOCUMENTS

| | | |
|---|---|---|
| CN | 203179892 | 9/2013 |
| CN | 105339996 | 2/2016 |
| CN | 106526947 | 3/2017 |
| CN | 107210315 | 9/2017 |
| CN | 108281456 | 7/2018 |
| CN | 109256456 | 1/2019 |
| CN | 109545832 | 3/2019 |
| CN | 110311027 | 10/2019 |
| CN | 111584722 | 8/2020 |
| EP | 3923339 | 12/2021 |
| EP | 3343551 | 1/2022 |
| JP | 2016-133730 | 7/2016 |
| WO | 2014/20694 | 12/2014 |
| WO | 2016/079505 | 5/2016 |

OTHER PUBLICATIONS

Vijay Kumar Baliyan et al., "Quantum Dot Arrays Fabricated Using In Situ Photopolymerization of a Reactive Mesogen and-Dielectrophoresis", Applied Materials & Interfaces, Aug. 13, 2020, pp. 40655-40661, vol. 12.

Yi-Jui Chen et al., "Direct synthesis of monolayer gold nanoparticles on epoxy based photoresist by photoreduction and application ot surface-enhanced Raman sensing", Materials and Design, Oct. 7, 2020, pp. 1-11.

* cited by examiner

DISPLAY DEVICE

This application claims priority to and benefits of Korean Patent Application No. 10-2022-0071652 under 35 U.S.C. § 119, filed on Jun. 13, 2022, in the Korean Intellectual Property Office (KIPO), the entire contents of which are incorporated herein by reference.

BACKGROUND

1. Technical Field

The disclosure relates to a display device.

2. Description of the Related Art

Recently, as interest in an information display is increasing, research and development for display devices are continuously being conducted.

SUMMARY

An object to be solved by the disclosure is to implement a high-resolution display device and to improve color reproducibility of the display device.

An object of the disclosure is not limited to the above-described object, and other technical objects which are not described will be clearly understood by those skilled in the art from the following description.

According to an embodiment of the disclosure for solving the above-described object, a display device may include first control electrodes on a light emitting element layer, second control electrodes on the first control electrodes, and a color conversion layer on the light emitting element layer. A first space may be disposed between the first control electrodes, a second space may be disposed between the second control electrodes, and the color conversion layer may be disposed at an intersection where the first space and the second space intersect.

The first control electrodes may extend in a first direction.

The second control electrodes may extend in a second direction intersecting the first direction.

The display device may further include an insulating layer between the first control electrodes and the second control electrodes.

The first space may extend in a first direction.

The second space may extend in a second direction intersecting the first direction.

The display device may further include a reflective layer on the color conversion layer.

The light emitting element layer may include a first electrode, a second electrode disposed on the first electrode, and an emission layer between the first electrode and the second electrode.

The intersection may overlap the emission layer in a plan view.

The color conversion layer may overlap the emission layer in a plan view.

According to an embodiment of the disclosure for solving the above-described object, a display device may include first control electrodes extending in a first direction on a light emitting element layer, second control electrodes extending in a second direction intersecting the first direction on the first control electrodes, an intersection surrounded by the first control electrodes and the second control electrodes in a plan view, a color conversion layer disposed at the intersection, and a reflective layer on the color conversion layer.

The intersection may include a first intersection, a second intersection, and a third intersection.

The color conversion layer may include a first color conversion layer disposed at the first intersection, a second color conversion layer disposed at the second intersection, and a scattering layer disposed at the third intersection.

The reflective layer may be directly disposed on the first color conversion layer, the second color conversion layer, and the scattering layer.

The reflective layer may include a first reflective layer on the first color conversion layer, and a second reflective layer on the second color conversion layer.

The first reflective layer and the second reflective layer may be offset from the scattering layer in a plan view.

The first reflective layer and the second reflective layer may be separated from each other.

The reflective layer may be directly disposed on a side surface of each of the first color conversion layer, the second color conversion layer, and the scattering layer.

The reflective layer may include an opening exposing an upper surface of each of the first color conversion layer, the second color conversion layer, and the scattering layer.

The opening may overlap the intersection in a plan view.

Details of other embodiments are included in the detailed description and drawings.

According to the above-described embodiment, by forming the color conversion layer in each pixel by dielectrophoresis and forming the reflective layer on the color conversion layer, a high-resolution display device may be implemented, and color reproducibility of the display device may be improved.

An effect according to embodiments is not limited by the contents illustrated above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Figure 1:
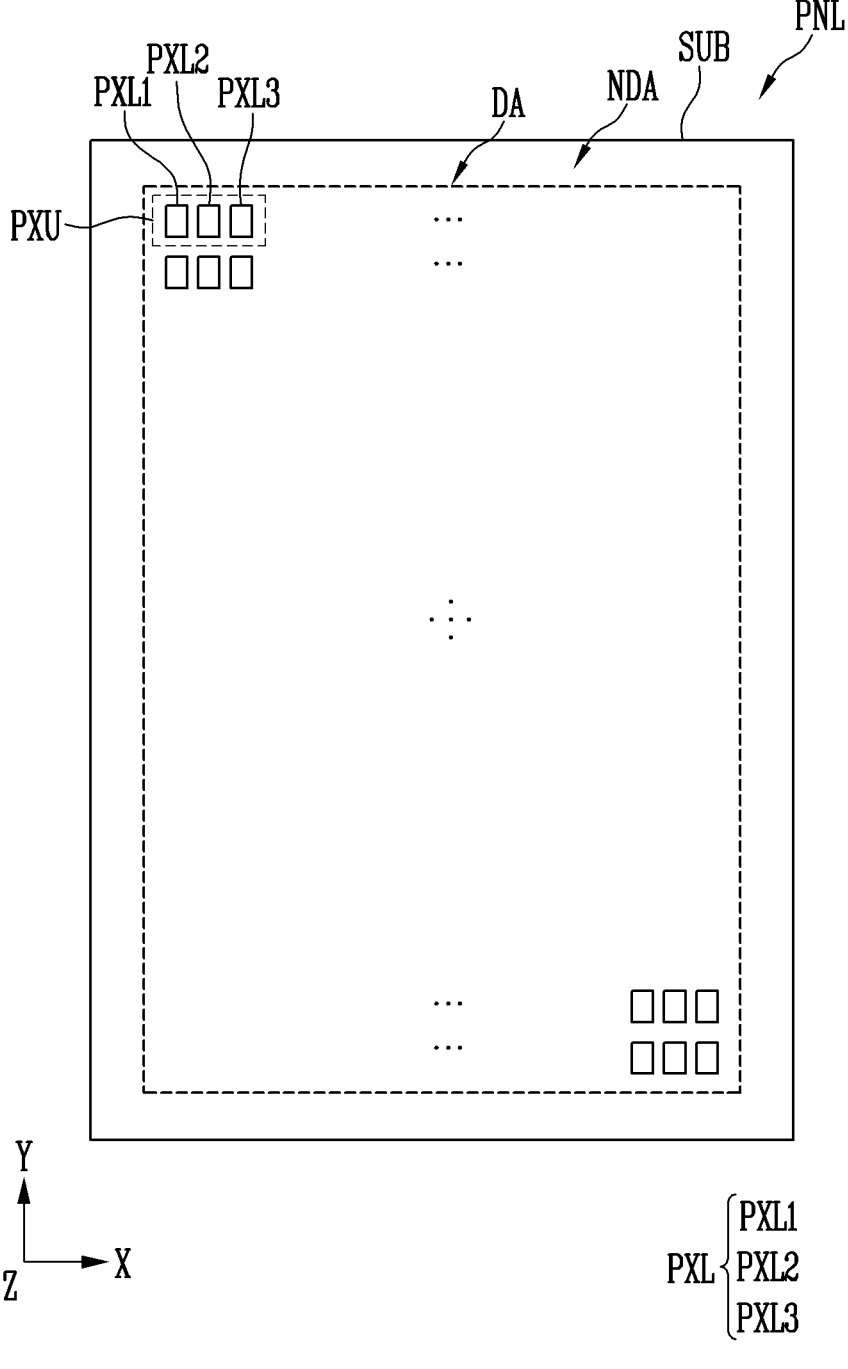
FIG. 1 is a plan view illustrating a display device according to an embodiment.

The advantages and features of the disclosure and a method of achieving them will become apparent with reference to the embodiments described in detail below together with the accompanying drawings. However, the disclosure is not limited to the embodiments disclosed below, and may be implemented in various different forms. The embodiments are provided so that the disclosure will be thorough and complete and those skilled in the art to which the disclosure pertains can fully understand the scope of the disclosure. The disclosure is only defined by the scope of the claims.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially", "about", and other similar terms, are used as terms of approximation and not as terms of degree, and, as such, are utilized to account for inherent deviations in measured, calculated, and/or provided values that would be recognized by one of ordinary skill in the art.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Also, when an element is referred to as being "in contact" or "contacted" or the like to another element, the element may be in "electrical contact" or in "physical contact" with another element; or in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although a first, a second, and the like are used to describe various components, these components are not limited by these terms. These terms are used only to distinguish one component from another component. Therefore, a first component described below may be a second component within the technical spirit of the disclosure.

Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure are described in detail with reference to the accompanying drawings.

FIG. 1 is a plan view illustrating a display device according to an embodiment.

In FIG. 1, a display panel PNL provided in the display device is shown. For convenience of description, in FIG. 1, a structure of the display panel PNL is briefly shown based on a display area DA. However, according to an embodiment, at least one driving circuit unit (for example, at least one of a scan driver and a data driver), lines, and/or pads, which are/is not shown, may be disposed on the display panel PNL.

Referring to FIG. 1, the display panel PNL and a substrate SUB for forming the same may include the display area DA for displaying an image and a non-display area NDA other than the display area DA. The display area DA may configure a screen on which an image is displayed, and the non-display area NDA may be a remaining area other than the display area DA.

A unit pixel PXU may be disposed in the display area DA. The unit pixel PXU may include a first pixel PXL1, a second pixel PXL2, and/or a third pixel PXL3. Hereinafter, when at least one pixel among the first pixel PXL1, the second pixel PXL2, and the third pixel PXL3 is arbitrarily referred to, or when two or more types of pixels are collectively referred to, the at least one pixel or the two or more types of pixels are referred to as a "pixel PXL" or "pixels PXL".

The pixels PXL may be regularly arranged in a stripe or PENTILE™ arrangement, or the like. However, an arrangement of the pixels PXL is not limited thereto, and the pixels PXL may be arranged in the display area DA in various structures and/or methods.

According to an embodiment, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one of the first to third pixels PXL1, PXL2, and PXL3 disposed to be adjacent to each other may configure one unit pixel PXU capable of emitting light of various colors. For example, the first pixel PXL1 may be a red pixel emitting red light, the second pixel PXL2 may be a green pixel emitting green light, and the third pixel PXL3 may be a blue pixel emitting blue light, but are not limited thereto. FIG. 1 illustrates a case where the unit pixel PXU includes one first pixel PXL1, one second pixel PXL2, and one third pixel PXL3, but the disclosure is not limited thereto, and the number of the first pixel PXL1, the second pixel PXL2, and the third pixel PXL3 may be variously changed. For example, the unit pixel PXU may include one first pixel PXL1, two second pixels PXL2, and one third pixel PXL3.

The first pixel PXL1, the second pixel PXL2, and the third pixel PXL3 may include light emitting elements that emit light of the same color, and may include a color conversion layer of different colors disposed on the respective light emitting elements, to emit light of the first color, the second color, and the third color, respectively.

The first pixel PXL1, the second pixel PXL2, and the third pixel PXL3 may include a light emitting element of the first color, a light emitting element of the second color, and a light emitting element of the third color as a light source, to emit light of the first color, the second color, and the third color, respectively. However, the color of the light emitted by each pixel PXL may be variously changed.

The pixel PXL may include at least one light emitting element driven by a control signal (for example, a scan signal and a data signal) and/or power (for example, first power and second power). For example, the pixel PXL may include an organic light emitting diode (OLED) or a flip chip type micro light emitting diode (LED), but is not limited thereto.

Each pixel PXL may be configured as an active pixel. However, a type, a structure, and/or a driving method of the pixel PXL of the display device are/is not particularly limited. For example, each pixel PXL may be configured as a pixel of a passive or active light emitting display device of various structures and/or driving methods.

Figure 2:
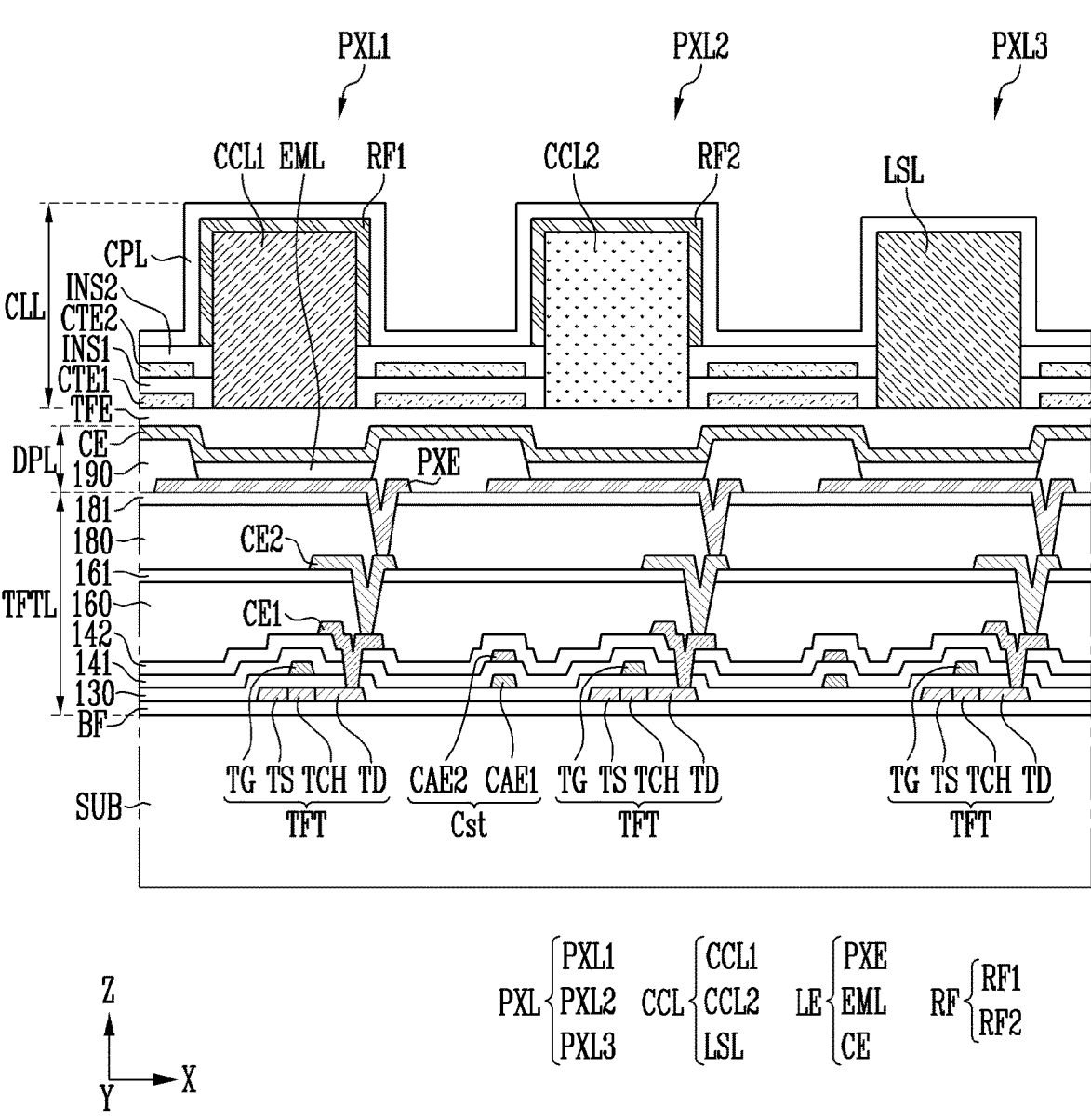
FIG. 2 is a schematic cross-sectional view illustrating a pixel according to an embodiment.
Figure 3:
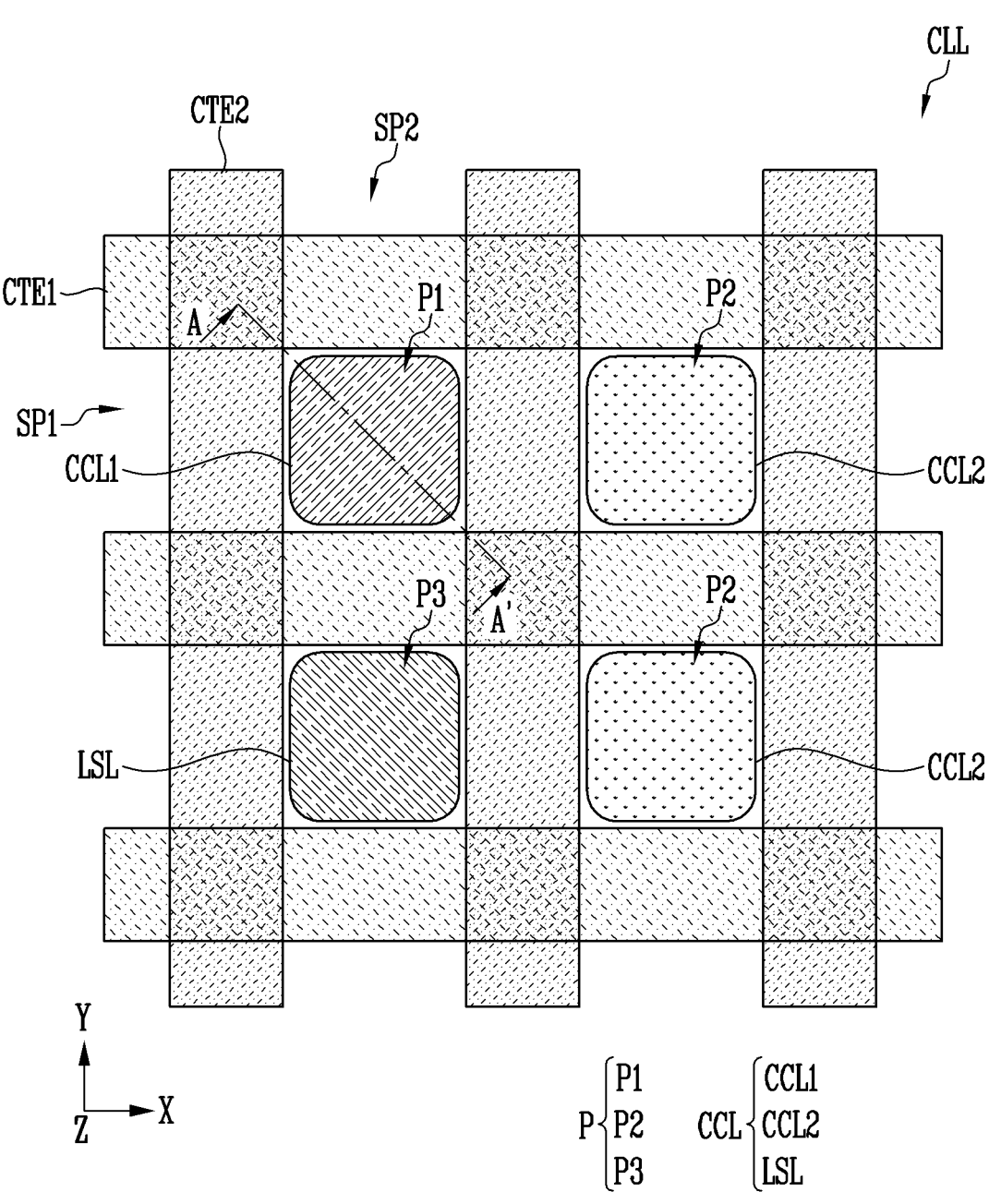
FIG. 3 is a plan view illustrating a color layer according to an embodiment.
Figure 4:
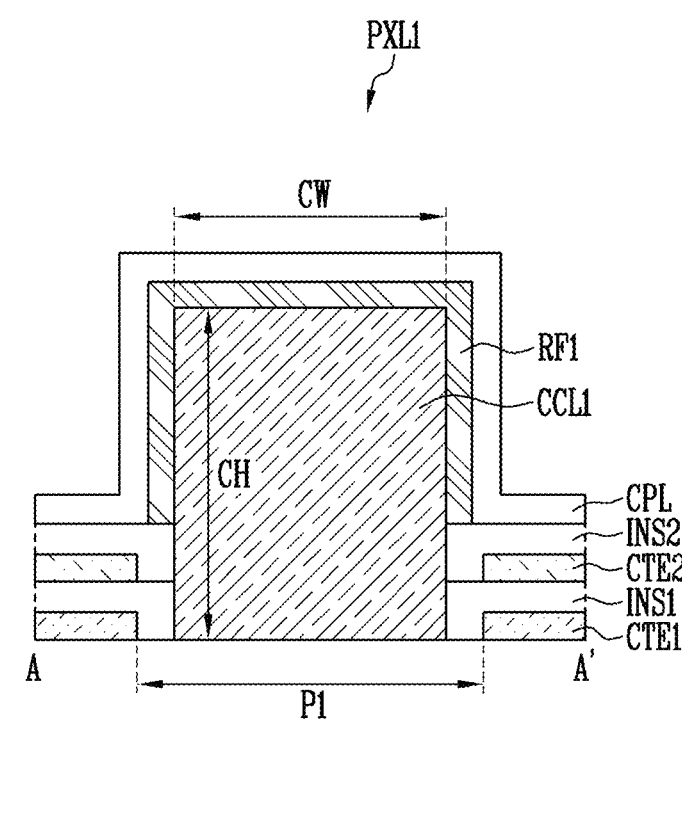
FIG. 4 is a schematic cross-sectional view taken along line A-A' of FIG. 3.

FIG. 2 is a schematic cross-sectional view illustrating a pixel according to an embodiment. FIG. 3 is a plan view illustrating a color layer according to an embodiment. FIG. 4 is a schematic cross-sectional view taken along line A-A' of FIG. 3.

Referring to FIG. 2, a thin film transistor layer TFTL may be disposed on the substrate SUB. The thin film transistor layer TFTL may be a layer on which thin film transistors (TFTs) are formed.

The substrate SUB may be a base substrate or a base member for supporting the display device. The substrate SUB may be a rigid substrate including a glass material. In another embodiment, the substrate SUB may be a flexible substrate of which bending, folding, rolling, or the like is possible. The substrate SUB may include an insulating material such as a polymer resin such as polyimide (PI).

A buffer layer BF may be disposed on a surface of the substrate SUB. The buffer layer BF may be a layer for preventing penetration of air or moisture. The buffer layer BF may be formed of multiple inorganic layers alternately stacked each other. For example, the buffer layer BF may be formed of multiple layers in which one or more inorganic layers such as silicon nitride ($SiN_x$), silicon oxynitride ($SiO_xN_y$), silicon oxide ($SiO_x$), titanium oxide ($TiO_x$), and aluminum oxide ($AlO_x$) are alternately stacked each other. According to an embodiment, the buffer layer BF may be omitted.

An active layer may be disposed on the buffer layer BF. The active layer may include a silicon semiconductor such as polycrystalline silicon, single crystal silicon, low-temperature polycrystalline silicon, and/or amorphous silicon, or may include an oxide semiconductor.

The active layer may include a channel TCH, a first electrode TS, and a second electrode TD of the thin film transistor TFT. The channel TCH of the thin film transistor TFT may be an area overlapping a gate electrode TG of the thin film transistor TFT in a third direction DR3 (Z-axis direction) that is a thickness direction of the substrate SUB. The first electrode TS of the thin film transistor TFT may be disposed on a side of the channel TCH, and the second electrode TD may be disposed on another side of the channel TCH. The first electrode TS and the second electrode TD of the thin film transistor TFT may be areas which do not overlap the gate electrode TG in the third direction DR3 (Z-axis direction). The first electrode TS and the second electrode TD of the thin film transistor TFT may be areas in which an ion is doped to a silicon semiconductor or an oxide semiconductor to have conductivity.

A gate insulating layer 130 may be disposed on the active layer. The gate insulating layer 130 may be an inorganic layer formed of, for example, silicon nitride ($SiN_x$), silicon oxynitride ($SiO_xN_y$), silicon oxide ($SiO_x$), titanium oxide ($TiO_x$), or aluminum oxide ($AlO_x$).

The gate electrode TG of the thin film transistor TFT and a first capacitor electrode CAE1 may be disposed on the gate insulating layer 130. The gate electrode TG and the first capacitor electrode CAE1 may be formed as a single layer or multiple layers formed of at least one of molybdenum (Mo), aluminum (Al), chromium (Cr), gold (Au), titanium (Ti), nickel (Ni), neodymium (Nd), and copper (Cu), or an alloy thereof.

A first interlayer insulating layer 141 may be disposed on the gate electrode TG and the first capacitor electrode CAE1. The first interlayer insulating layer 141 may be an inorganic layer formed of, for example, silicon nitride ($SiN_x$), silicon oxynitride ($SiO_xN_y$), silicon oxide ($SiO_x$), titanium oxide ($TiO_x$), or aluminum oxide ($AlO_x$).

A second capacitor electrode CAE2 may be disposed on the first interlayer insulating layer 141. The second capacitor electrode CAE2 may be formed as a single layer or multiple layers formed of at least one of molybdenum (Mo), aluminum (Al), chromium (Cr), gold (Au), titanium (Ti), nickel (Ni), neodymium (Nd), and copper (Cu), or an alloy thereof.

A second interlayer insulating layer 142 may be disposed on the second capacitor electrode CAE2. The second interlayer insulating layer 142 may be an inorganic layer formed of, for example, silicon nitride ($SiN_x$), silicon oxynitride ($SiO_xN_y$), silicon oxide ($SiO_x$), titanium oxide ($TiO_x$), or aluminum oxide ($AlO_x$).

A first connection electrode CE1 may be disposed on the second interlayer insulating layer 142. The first connection electrode CE1 may be formed as a single layer or multiple layers formed of at least one of molybdenum (Mo), aluminum (Al), chromium (Cr), gold (Au), titanium (Ti), nickel (Ni), neodymium (Nd), and copper (Cu), or an alloy thereof.

The first connection electrode CE1 may be electrically connected to the first electrode TS or the second electrode TD of the thin film transistor TFT through a contact hole passing through the gate insulating layer 130, the first interlayer insulating layer 141, and/or the second interlayer insulating layer 142.

A first planarization layer 160 for flattening a step difference may be formed on the first connection electrode CE1. The first planarization layer 160 may be an organic layer formed of, for example, an acryl resin, an epoxy resin, a phenolic resin, a polyamide resin, or a polyimide resin.

A first insulating layer 161 may be disposed on the first planarization layer 160. The first insulating layer 161 may be an inorganic layer formed of, for example, silicon nitride ($SiN_x$), silicon oxynitride ($SiO_xN_y$), silicon oxide ($SiO_x$), titanium oxide ($TiO_x$), or aluminum oxide ($AlO_x$).

A second connection electrode CE2 may be disposed on the first insulating layer 161. The second connection electrode CE2 may be electrically connected to the first connection electrode CE1 through a contact hole passing through the first insulating layer 161 and the first planarization layer 160. The second connection electrode CE2 may be formed as a single layer or multiple layers formed of at least one of molybdenum (Mo), aluminum (Al), chromium (Cr), gold (Au), titanium (Ti), nickel (Ni), neodymium (Nd), and copper (Cu), or an alloy thereof.

A second planarization layer 180 for flattening a step difference may be formed on the second connection electrode CE2. The second planarization layer 180 may be an organic layer formed of, for example an acryl resin, an epoxy resin, a phenolic resin, a polyamide resin, or a polyimide resin.

A second insulating layer 181 may be disposed on the second planarization layer 180. The second insulating layer 181 may be an inorganic layer formed of, for example, silicon nitride (SiN$_x$), silicon oxynitride (SiO$_x$N$_y$), silicon oxide (SiO$_x$), titanium oxide (TiO$_x$), or aluminum oxide (AlO$_x$).

A light emitting element layer DPL may be disposed on the second insulating layer 181. The light emitting element layer DPL may include a first electrode PXE, a bank 190, an emission layer EML, and/or a second electrode CE.

The first electrode PXE may be disposed on the second insulating layer 181. The first electrode PXE may be a pixel electrode disposed in each of the first to third pixels PXL1, PXL2, and PXL3. The first electrode PXE may be an anode electrode. The first electrode PXE may be electrically connected to the second connection electrode CE2 through a contact hole passing through the second insulating layer 181 and the second planarization layer 180. The first electrode PXE may be electrically connected to the thin film transistor TFT through the second connection electrode CE2.

The bank 190 may be disposed on the first electrode PXE. The bank 190 may be formed of an organic layer such as an acrylic resin, an epoxy resin, a phenolic resin, a polyamide resin, or a polyimide resin. The bank 190 may include an opening partially exposing the first electrode PXE.

The emission layer EML may be disposed on the first electrode PXE exposed by the opening of the bank 190. The emission layer EML may include an organic emission layer, a hole injection layer, a hole transport layer, an electron injection layer, and/or an electron transport layer. The second electrode CE may be disposed on the emission layer EML. The second electrode CE may be a common electrode disposed throughout the first to third pixels PXL1, PXL2, and PXL3. The second electrode CE may be a cathode electrode.

The first electrode PXE, the emission layer EML, and the second electrode CE described above may configure a light emitting element LE as an organic light emitting diode.

An encapsulation layer TFE may be disposed on the second electrode CE of the light emitting element layer DPL. The encapsulation layer TFE may include multiple inorganic layers. Although not shown separately, the encapsulation layer TFE may be formed of multiple layers including a first inorganic layer, an organic layer, and a second inorganic layer sequentially stacked. The first inorganic layer and the second inorganic layer may include at least one of silicon nitride (SiN$_x$), silicon oxynitride (SiO$_x$N$_y$), silicon oxide (SiO$_x$), titanium oxide (TiO$_x$), and aluminum oxide (AlO$_x$), and the organic layer may include at least one of an acrylic resin, an epoxy resin, a phenolic resin, a polyamide resin, and a polyimide resin.

A color layer CLL may be disposed on the encapsulation layer TFE. The color layer CLL may include control electrodes CTE1 and CTE2, insulating layers INS1 and INS2, a color conversion layer CCL, a reflective layer RF, and/or a capping layer CPL.

Referring to FIGS. 2 to 4, first control electrodes CTE1 may be disposed on the light emitting element layer DPL and the encapsulation layer TFE. The first control electrodes CTE1 may extend in a first direction (X-axis direction). The first control electrodes CTE1 may be spaced apart from each other in a second direction (Y-axis direction). A first space SP1 may be positioned between the first control electrodes CTE1. The first space SP1 may extend in the first direction (X-axis direction).

A first insulating layer INS1 may be disposed on the first control electrodes CTE1. The first insulating layer INS1 may include silicon nitride (SiN$_x$), silicon oxynitride (SiO$_x$N$_y$), silicon oxide (SiO$_x$), titanium oxide (TiO$_x$), or aluminum oxide (AlO$_x$), but is not limited thereto.

Second control electrodes CTE2 may be disposed on the first insulating layer INS1. The second control electrodes CTE2 may extend in the second direction (Y-axis direction). The second control electrodes CTE2 may be spaced apart from each other in the first direction (X-axis direction). A second space SP2 may be positioned between the second control electrodes CTE2. The second space SP2 may extend in the second direction (Y-axis direction).

A second insulating layer INS2 may be disposed on the second control electrodes CTE2. The second insulating layer INS2 may include silicon nitride (SiN$_x$), silicon oxynitride (SiO$_x$N$_y$), silicon oxide (SiO$_x$), titanium oxide (TiO$_x$), or aluminum oxide (AlO$_x$), but is not limited thereto.

The color conversion layer CCL may be positioned at an intersection P where the first space SP1 and the second space SP2 intersect each other. For example, a color conversion layer particle may be formed by a photopolymerization reaction by irradiating ultraviolet rays on a solution under a non-uniform electric field, and at the same time, the color conversion layer particle may be moved between the control electrodes CTE1 and CTE2 by dielectrophoresis (DEP) to, for example, the intersection P where a strong electric field is formed, to form the color conversion layer CCL at the intersection P. As described above, in case that the color conversion layer CCL is formed by DEP, a high-resolution display device may be implemented, and color reproducibility of the display device may be improved. For example, a height and a width of the color conversion layer CCL may be adjusted by controlling a movement of the color conversion layer particle by the DEP. For example, a thickness CH in the third direction (Z-axis direction) of the color conversion layer CCL may be greater than the width CW in the first direction (X-axis direction). As described above, in case that the color conversion layer CCL has a columnar shape of which the thickness CH is greater than the width CW, a light efficiency of the pixel PXL by the color conversion layer CCL may be maximized and excellent color reproducibility may be secured. In FIG. 3, the control electrodes CTE1 and CTE2 intersecting each other and the color conversion layer CCL positioned at the intersection P are illustrated, but design of the control electrodes CTE1 and CTE2 may be variously changed in consideration of a distribution of the electric field and a particle characteristic of the color conversion layer CCL.

The intersection P may include first to third intersections P1, P2, and P3. The first intersection P1 may be a point at which the first space SP1 of a first row and a second space SP2 of a first column intersect. The second intersection P2 may be a point at which the first space SP1 of the first row and the second space SP2 of a second column intersect, and a point at which the first space SP1 of a second row and the second space SP2 of the second column intersect. The third intersection P3 may be a point at which the first space SP1 of the second row and the second space SP2 of the first column intersect. The first to third intersections P1, P2, and P3 may overlap the first to third pixels PXL1, PXL2, and PXL3, respectively. For example, the first to third intersections P1, P2, and P3 may overlap the emission layer EML of the first to third pixels PXL1, PXL2, and PXL3, respectively. However, the first to third intersection P1, P2, and P3 are not limited to the positions illustrated in FIG. 3, and may be variously changed depending on positions of the first to third pixels PXL1, PXL2, and PXL3.

The color conversion layer CCL may include a first color conversion layer CCL1 positioned at the first intersection P1, a second color conversion layer CCL2 positioned at the second intersection P2, and a scattering layer LSL positioned at the third intersection portion P3.

According to an embodiment, the color conversion layer CCL may be positioned in an opening formed in the intersection P (or the pixels PXL). The opening may pass through the first insulating layer INS1 and the second insulating layer INS2 at the intersection P (or the pixels PXL) to provide a space in which the color conversion layer CCL may be provided. For example, the first color conversion layer CCL1 may be positioned in an opening formed in the first intersection P1 (or the first pixel PXL1), the second color conversion layer CCL2 may be positioned in an opening formed in the second intersection P2 (or the second pixel PXL2), and the scattering layer LSL may be positioned in an opening formed in the third intersection P3 (or the third pixel PXL3).

The first color conversion layer CCL1 may overlap the light emitting element LE (or the emission layer EML) of the first pixel PXL1, the second color conversion layer CCL2 may overlap the light emitting element LE (or the emission layer EML) of the second pixel PXL2, and the scattering layer LSL may overlap the light emitting element LE (or the emission layer EML) of the third pixel PXL3 in the third direction (Z-axis direction). According to an embodiment, the first to third pixels PXL1, PXL2, and PXL3 may include a light emitting element LE (or an emission layer EML) emitting light of the same color. For example, the first to third pixels PXL1, PXL2, and PXL3 may include a light emitting element LE (or an emission layer EML) emitting light of a third color (or blue). A full-color image may be displayed by disposing the color conversion layers CCL including color conversion particles on the first to third pixels PXL1, PXL2, and PXL3, respectively.

The first color conversion layer CCL1 may include first color conversion particles that convert the light of the third color emitted from the light emitting element LE (or the emission layer EML) into the light of the first color. For example, the first color conversion layer CCL1 may include multiple first quantum dots dispersed in a matrix material such as a base resin.

According to an embodiment, in case that the light emitting element LE (or the emission layer EML) is a blue light emitting element emitting blue light and the first pixel PXL1 is a red pixel, the first color conversion layer CCL1 may include a first quantum dot that converts the blue light emitted from the blue light emitting element into red light. The first quantum dot may absorb the blue light and shift a wavelength by an energy transition to emit the red light. In case that the first pixel PXL1 is a pixel of a different color, the first color conversion layer CCL1 may include a first quantum dot corresponding to the color of the first pixel PXL1.

The second color conversion layer CCL2 may include second color conversion particles that convert the light of the third color emitted from the light emitting element LE (or the emission layer EML) into the light of the second color. For example, the second color conversion layer CCL2 may include multiple second quantum dots dispersed in a matrix material such as a base resin.

According to an embodiment, in case that the light emitting element LE (or the emission layer EML) is a blue light emitting element emitting blue light and the second pixel PXL2 is a green pixel, the second color conversion layer CCL2 may include a second quantum dot that converts the blue light emitted from the blue light emitting element into green light. The second quantum dot may absorb the blue light and shift a wavelength by an energy transition to emit the green light. In case that the second pixel PXL2 is a pixel of a different color, the second color conversion layer CCL2 may include a second quantum dot corresponding to the color of the second pixel PXL2.

According to an embodiment, absorption coefficients of the first quantum dot and the second quantum dot may be increased by inputting blue light having a relatively short wavelength within a visible light area to each of the first quantum dot and the second quantum dot. Accordingly, efficiency of light emitted from the first pixel PXL1 and the second pixel PXL2 may be improved, and excellent color reproducibility may be secured. By configuring the first to third pixels PXL1, PXL2, and PXL3 using the light emitting element LE (or the emission layer EML) of the same color, manufacturing efficiency of the display device may be increased.

The scattering layer LSL may be provided to efficiently use the light of the third color (or blue) emitted from the light emitting element LE (or the emission layer EML). For example, in case that the light emitting element LE (or the emission layer EML) is a blue light emitting element emitting blue light and the third pixel PXL3 is a blue pixel, the scattering layer LSL may include at least one type of scatterer in order to efficiently use the light emitted from the light emitting element LE (or the emission layer EML). For example, the scatterer of the scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The scatterer may be disposed in a pixel in addition to the third pixel PXL3, for example, the scatterer may be selectively included in the first color conversion layer CCL1 or the second color conversion layer CCL2. According to an embodiment, the scatterer may be omitted and the scattering layer LSL formed of a transparent polymer may be provided.

The reflective layer RF may be disposed on the color conversion layer CCL. The reflective layer RF may improve light efficiency by recycling light transmitted without being absorbed by the color conversion layer CCL, and may improve color reproducibility by preventing color mixing between adjacent pixels PXL. A material of the reflective layer RF is not particularly limited, and may include various reflective materials.

The reflective layer RF may be directly disposed on the color conversion layer CCL. The reflective layer RF may include a first reflective layer RF1 on the first color conversion layer CCL1 and a second reflective layer RF2 on the second color conversion layer CCL2. The first reflective layer RF1 and the second reflective layer RF2 may be separated from each other and disposed on the first color conversion layer CCL1 and the second color conversion layer CCL2, respectively. The first reflective layer RF1 may be directly disposed on the first color conversion layer CCL1, and the second reflective layer RF2 may be directly disposed on the second color conversion layer CCL2. The first reflective layer RF1 may be directly disposed on a side surface and an upper surface of the first color conversion layer CCL1. For example, the first reflective layer RF1 on the upper surface of the first color conversion layer CCL1 may overlap the light emitting element LE (or the emission layer EML) of the first pixel PXL1. The second reflective layer RF2 may be directly disposed on a side surface and an upper surface of the second color conversion layer CCL2. For example, the second reflective layer RF2 on the upper surface of the second color conversion layer CCL2 may overlap the light emitting element LE (or the emission layer EML) of the second pixel PXL2.

According to an embodiment, the reflective layer RF may have a characteristic of selectively reflecting a specific wavelength. For example, the reflective layer RF may reflect blue light and transmit red light or green light. Therefore, since the first reflective layer RF1 and the second reflective layer RF2 cover the side surface and the upper surface of the first color conversion layer CCL1 and the second color conversion layer CCL2, respectively, the light efficiency and the color reproducibility may be improved by transmitting each of the red light and the green light and recycling the blue light. The first reflective layer RF1 and the second reflective layer RF2 may overlap the light emitting element LE (or the emission layer EML) of the first pixel PXL1 and the second pixel PXL2, respectively, but are not limited thereto. In an embodiment, in case that the reflective layer RF has a reflective characteristic for the blue light, the reflective layer RF may be omitted from the third pixel PXL3 and may not overlap the scattering layer LSL, but is not limited thereto. The first reflective layer RF1 and the second reflective layer RF2 may include metallic nanoparticles formed by a photoreduction reaction on surfaces of the first color conversion layer CCL1 and the second color conversion layer CCL2, respectively, but are not limited thereto.

The capping layer CPL may be disposed on the reflective layer RF. The capping layer CPL may be provided on all of the first to third pixels PXL1, PXL2, and PXL3. The capping layer CPL may prevent an impurity such as moisture or air from passing through from an outside to damage or contaminate the color conversion layer CCL.

The capping layer CPL may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), or the like.

According to the embodiment, the color conversion layer CCL may be formed in each pixel PXL by the DEP, and the reflective layer may be formed on the color conversion layer CCL to implement a high-resolution display device and improve color reproducibility of the display device.

Figure 5:
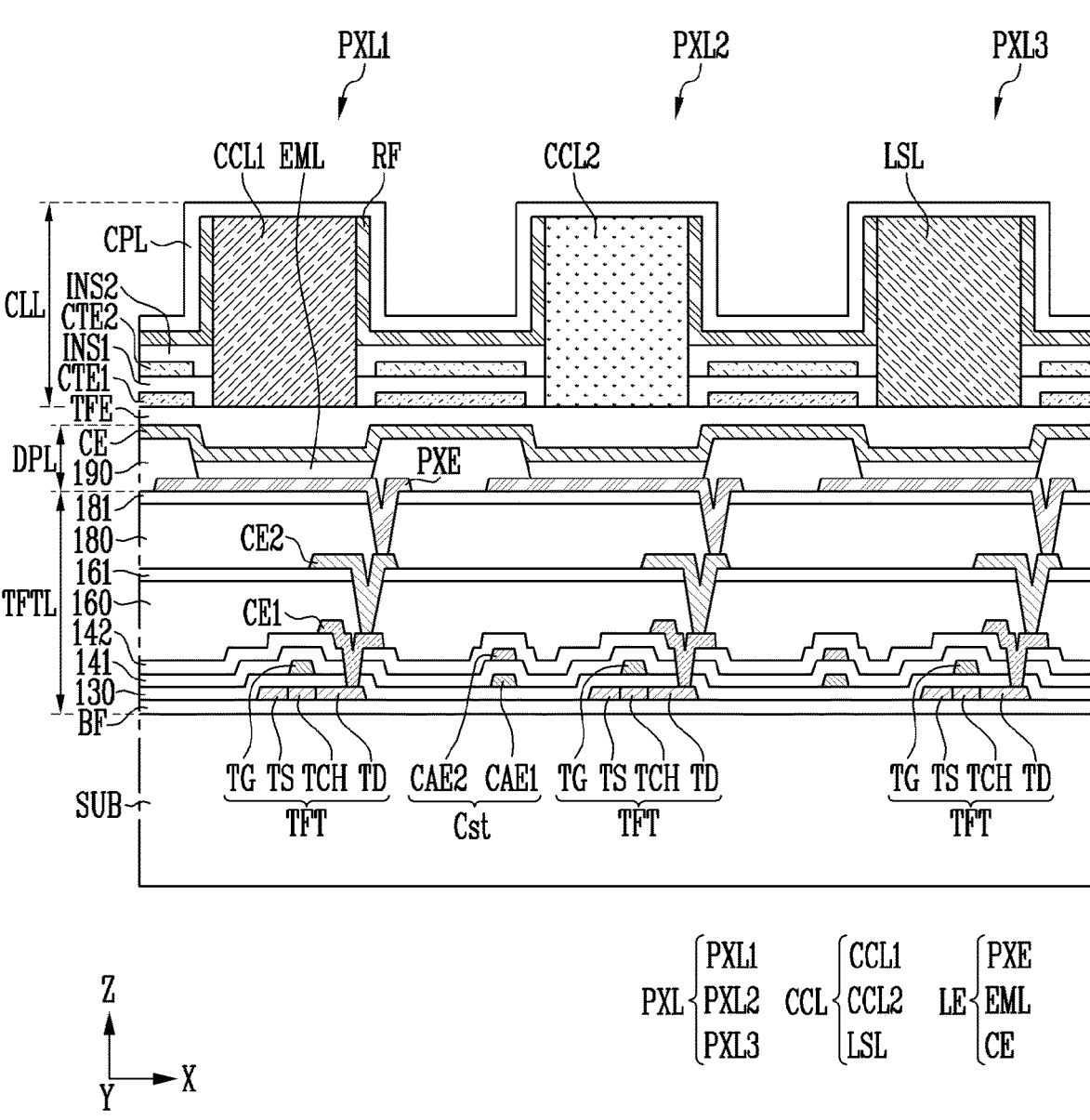
FIG. 5 is a schematic cross-sectional view illustrating a pixel according to an embodiment.

FIG. 5 is a schematic cross-sectional view illustrating a pixel according to an embodiment.

Referring to FIG. 5, the reflective layer RF may be positioned in the first to third pixels PXL1, PXL2, and PXL3. The reflective layer RF may improve light efficiency by recycling light transmitted without being absorbed by the color conversion layer CCL, and may improve color reproducibility by preventing color mixing between adjacent pixels PXL. A material of the reflective layer RF is not particularly limited, and may include various reflective materials.

The reflective layer RF may be directly disposed on the color conversion layer CCL. The reflective layer RF may be directly disposed on the first color conversion layer CCL1, the second color conversion layer CCL2, and the scattering layer LSL. The reflective layer RF may be directly disposed on a side surface of the first color conversion layer CCL1, the second color conversion layer CCL2, and the scattering layer LSL. As described above, since the reflective layer RF may be disposed on the side surface of the color conversion layer CCL, light efficiency may be improved by recycling light transmitted without being absorbed by the color conversion layer CCL to improve.

According to an embodiment, the reflective layer RF may also be disposed between the first color conversion layer CCL1, the second color conversion layer CCL2, and the scattering layer LSL as well as on the side surface of the first color conversion layer CCL1, the second color conversion layer CCL2, and the scattering layer LSL. For example, the reflective layer RF may be positioned between the first to third pixels PXL1, PXL2, and PXL3 to prevent color mixing between adjacent pixels PXL to improve color reproducibility.

The reflective layer RF may include openings overlapping the intersection P. The openings of the reflective layer RF may expose an upper surface of each of the first color conversion layer CCL1, the second color conversion layer CCL2, and the scattering layer LSL. The openings of the reflective layer RF may overlap the light emitting element LE (or the emission layer EML) of the first to third pixels PXL1, PXL2, and PXL3, respectively. Light emitted from the color conversion layer CCL may be emitted to an upper portion of the first to third pixels PXL1, PXL2, and PXL3 through the opening of the reflective layer RF.

The capping layer CPL may be disposed on the reflective layer RF. The capping layer CPL may be provided on all of the first to third pixels PXL1, PXL2, and PXL3. The capping layer CPL may directly cover the upper surface of each of the first color conversion layer CCL1, the second color conversion layer CCL2, and the scattering layer LSL exposed by the opening of the reflective layer RF. The capping layer CPL may prevent an impurity such as moisture or air from entering from an outside to damage or contaminate the color conversion layer CCL.

Since the color conversion layer CCL and the like are described in detail with reference to FIG. 2, an overlapping content is omitted.

Figure 6:
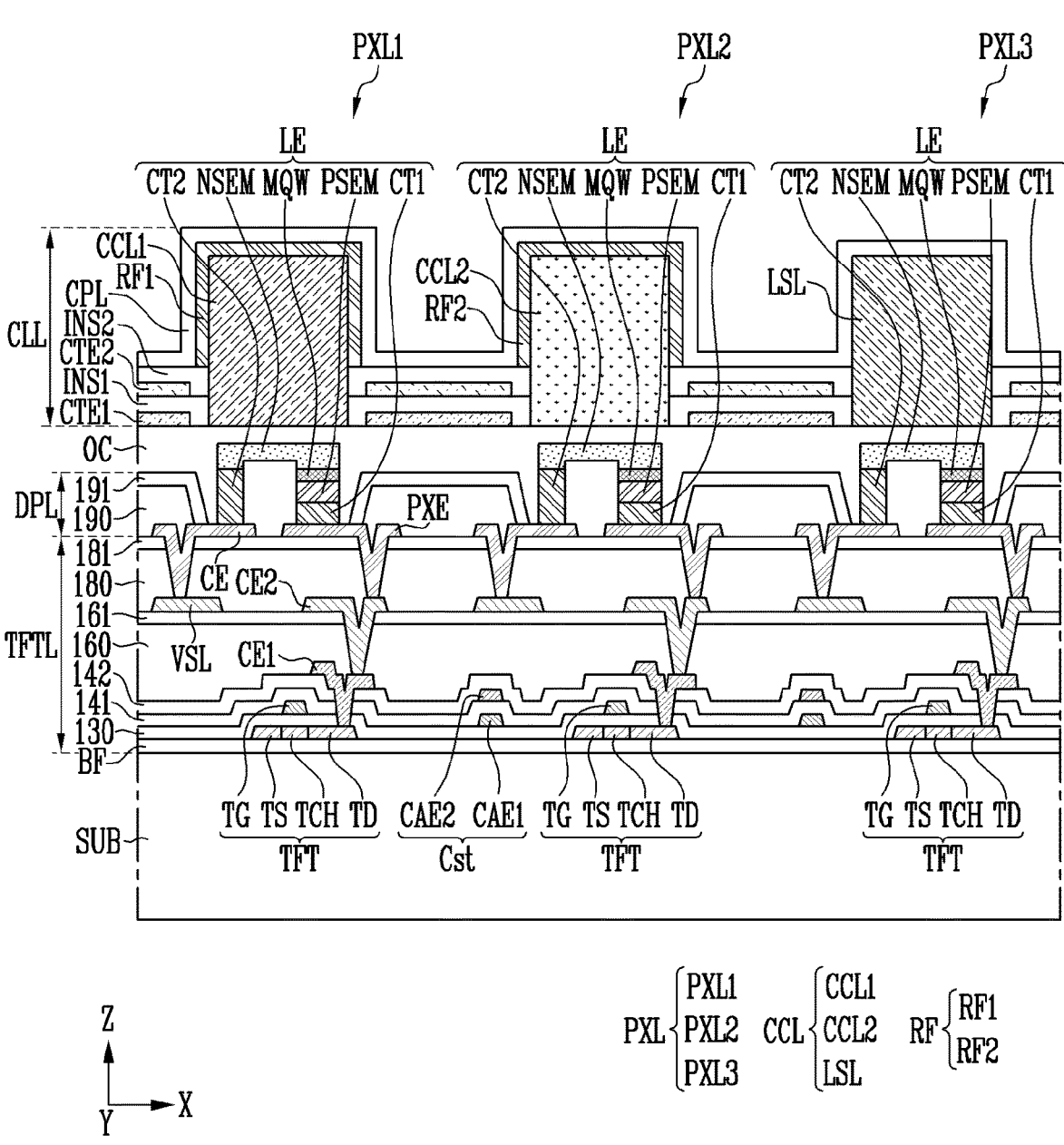
FIG. 6 is a schematic cross-sectional view illustrating a pixel according to an embodiment.

FIG. 6 is a schematic cross-sectional view illustrating a pixel according to an embodiment.

Referring to FIG. 6, the light emitting element layer DPL may include flip chip type light emitting elements LE.

The first electrodes PXE and the second electrodes CE may be disposed on the second insulating layer 181. Each of the first electrodes PXE may be electrically connected to the second connection electrode CE2 through a contact hole passing through the second insulating layer 181 and the second planarization layer 180. Each of the first electrodes PXE may be electrically connected to the first electrode TS or the second electrode TD of the thin film transistor TFT through the first connection electrode CE1 and the second connection electrode CE2. Each of the second electrodes CE may be electrically connected to a first power line VSL through a contact hole passing through the second insulating layer 181 and the second planarization layer 180. FIG. 6 illustrates a case in which the first electrode PXE and the second electrode CE are positioned on the same layer, but is not limited thereto.

FIG. 6 illustrates that each of the light emitting elements LE is a flip-chip type micro LED in which a first contact electrode CT1 and a second contact electrode CT2 are disposed to face the first electrode PXE and the second electrode CE. The light emitting element LE may be formed of an inorganic material such as GaN. In the light emitting element LE, each of a length in the first direction (X-axis direction), a length in the second direction (Y-axis direction), and a length in the third direction (Z-axis direction) may be several to several hundred μm. For example, in the light emitting element LE, each of the length in the first direction (X-axis direction), the length in the second direction (Y-axis direction), and the length in the third direction (Z-axis direction) may be equal to or less than about 100 μm, but is not limited thereto.

Each of the light emitting elements LE may have a light emitting structure including an n-type semiconductor NSEM, an active layer MQW, a p-type semiconductor PSEM, a first contact electrode CT1, and/or a second contact electrode CT2.

A portion of the n-type semiconductor NSEM may be disposed on the active layer MQW. A portion of the n-type semiconductor NSEM may be disposed on the second contact electrode CT2. According to an embodiment, one surface of the n-type semiconductor NSEM may face a display surface. The n-type semiconductor NSEM may be formed of GaN doped with an n-type dopant such as Si, Ge, or Sn.

The active layer MQW may be disposed on a portion of the n-type semiconductor NSEM. The active layer MQW may be disposed between the n-type semiconductor NSEM and the p-type semiconductor PSEM. The active layer MQW may include a material of a single or multiple quantum well structure. In case that the active layer MQW includes a material of the multiple quantum well structure, the active layer MQW may have a structure in which multiple well layers and barrier layers are alternately stacked each other. The well layer may be formed of InGaN, and the barrier layer may be formed of GaN or AIGaN, but are not limited thereto. In another embodiment, the active layer MQW may have a structure in which a semiconductor material having a large band gap energy and a semiconductor material having a small band gap energy are alternately stacked each other, and may also include group 3 to group 5 semiconductor materials depending on a wavelength band of emitted light.

The p-type semiconductor PSEM may be disposed on a surface of the active layer MQW. The p-type semiconductor PSEM may be formed of GaN doped with a p-type dopant such as Mg, Zn, Ca, Se, or Ba.

The first contact electrode CT1 may be disposed on the p-type semiconductor PSEM, and the second contact electrode CT2 may be disposed on another portion of the n-type semiconductor NSEM. The another portion of the n-type semiconductor NSEM on which the second contact electrode CT2 is disposed may be disposed to be spaced apart from the portion of the n-type semiconductor NSEM on which the active layer MQW is disposed.

The first contact electrode CT1 and the first electrode PXE may be adhered to each other through a conductive adhesive member such as an anisotropic conductive film (ACF) or an anisotropic conductive paste (ACP). In another embodiment, the first contact electrode CT1 and the first electrode PXE may be adhered to each other through a soldering process.

The bank 190 may be disposed on the first electrode PXE and/or the second electrode CE. The bank 190 may be formed of an organic layer such as an acrylic resin, an epoxy resin, a phenolic resin, a polyamide resin, or a polyimide resin. The bank 190 may include an opening partially exposing the first electrode PXE and/or the second electrode CE.

The third insulating layer 191 may be disposed on the bank 190. The third insulating layer 191 may cover an edge of the first electrode PXE and an edge of the second electrode CE. The third insulating layer 191 may be formed of an inorganic layer, for example, silicon nitride ($SiN_x$), silicon oxynitride ($SiO_xN_y$), silicon oxide ($SiO_x$), titanium oxide ($TiO_x$), or aluminum oxide ($AlO_x$).

Since the color layer CLL and the like are described in detail with reference to FIG. 2, an overlapping content is omitted.

A method of manufacturing the display device according to the above-described embodiment is described.

FIGS. 7 to 15 are schematic cross-sectional views for each process step illustrating a method of manufacturing a display device according to an embodiment. FIGS. 7 to 15 are schematic cross-sectional views illustrating a method of manufacturing the display device of FIG. 2, and for convenience of description, the figures are simplified and detailed reference numerals are omitted.

Figure 7:
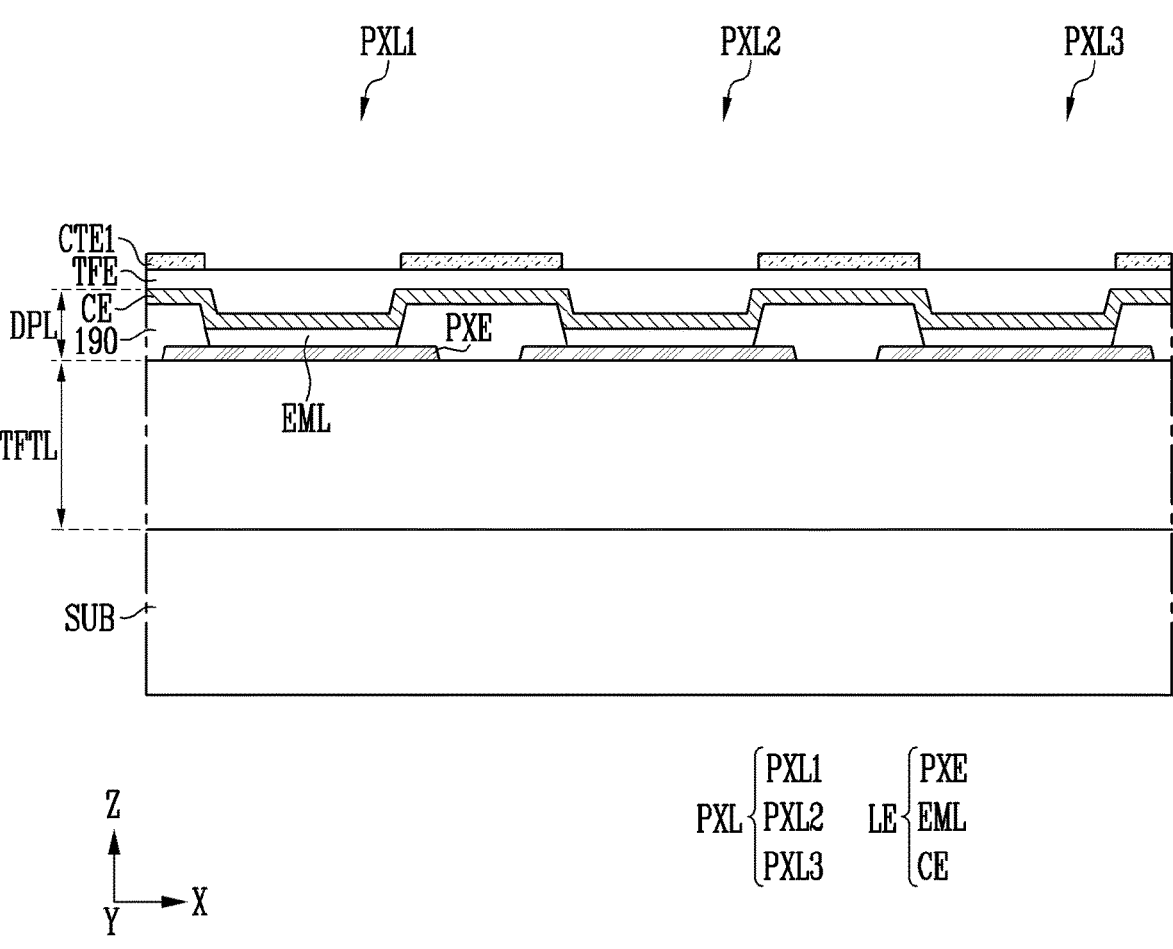
FIGS. 7 to 15 are schematic cross-sectional views for each process step illustrating a method of manufacturing a display device according to an embodiment.

Referring to FIG. 7, the first control electrodes CTE1 may be formed on the thin film transistor layer TFTL and the light emitting element layer DPL formed on the substrate SUB. The first control electrodes CTE1 may be formed between the first to third pixels PXL1, PXL2, and PXL3. The first control electrodes CTE1 may not overlap the light emitting element LE (or the emission layer EML) of the first to third pixels PXL1, PXL2, and PXL3. Since a planar disposition of the first control electrodes CTE1 is described in detail with reference to FIG. 3, an overlapping content is omitted.

Figure 8:
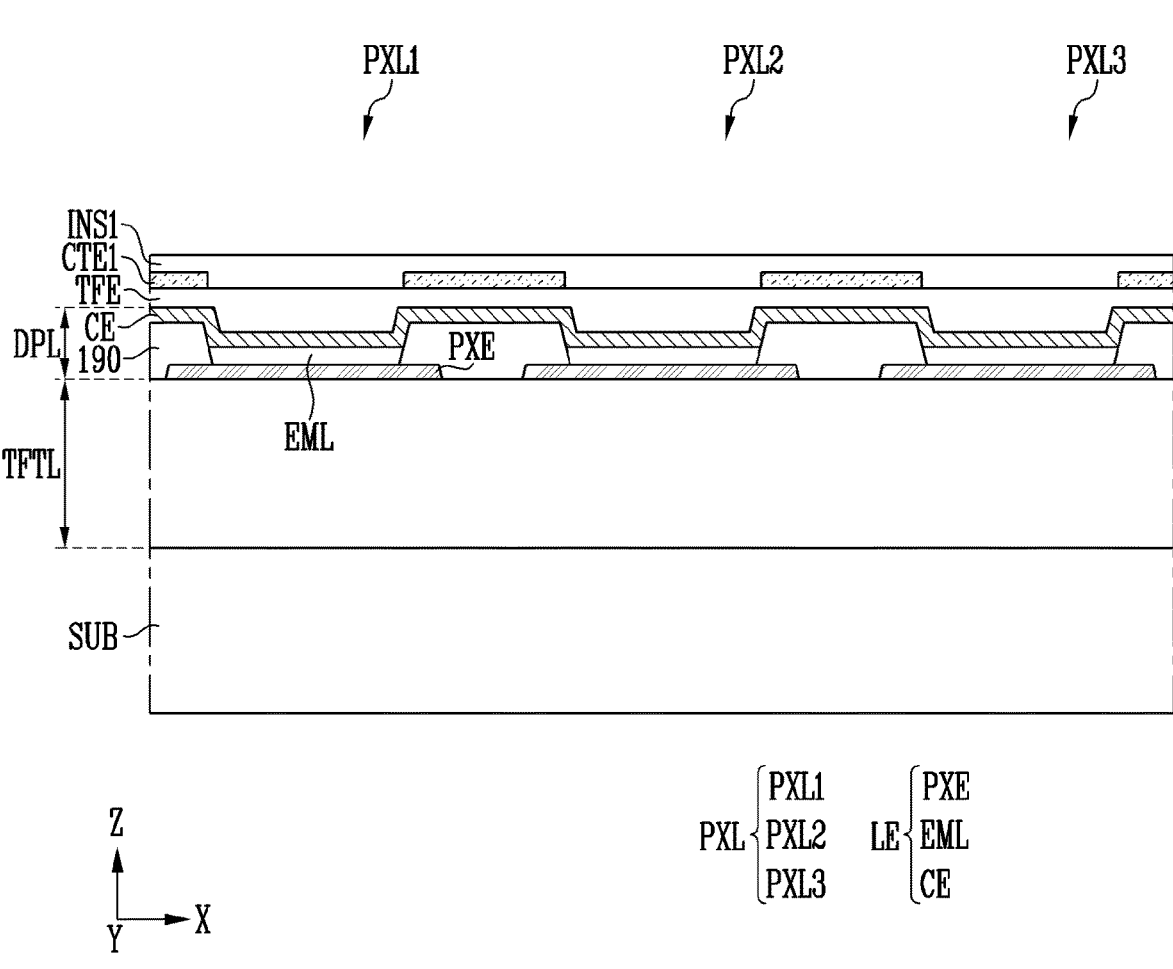

Referring to FIG. 8, the first insulating layer INS1 may be formed on the first control electrodes CTE1. The first insulating layer INS1 may be directly disposed on the first control electrodes CTE1. The first insulating layer INS1 may be formed throughout the first to third pixels PXL1, PXL2, and PXL3.

Figure 9:
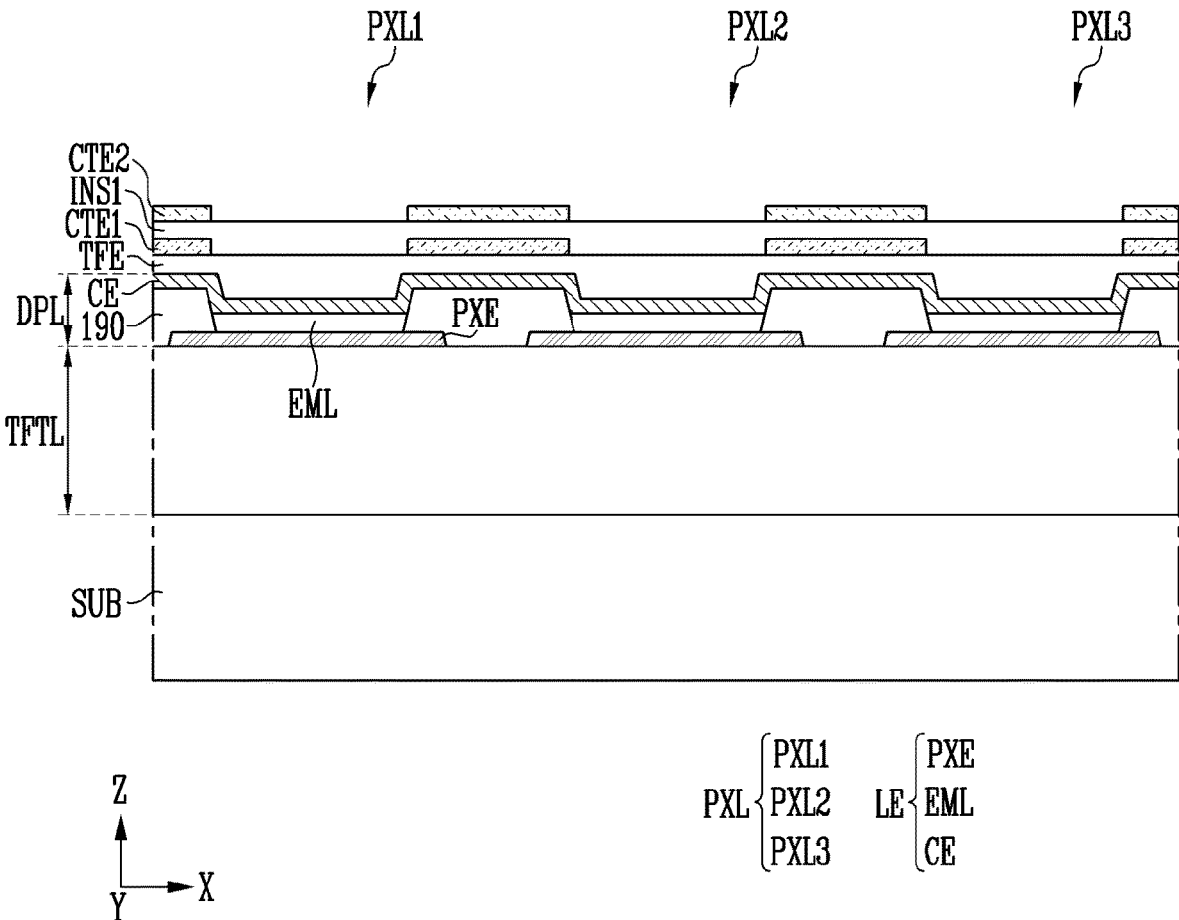

Referring to FIG. 9, the second control electrodes CTE2 may be formed on the first insulating layer INS1. The second control electrodes CTE2 may be formed between the first to third pixels PXL1, PXL2, and PXL3. The second control electrodes CTE2 may not overlap the light emitting element LE (or the emission layer EML) of the first to third pixels PXL1, PXL2, and PXL3. Since a planar disposition of the second control electrodes CTE2 is described in detail with reference to FIG. 3, an overlapping content is omitted.

Figure 10:
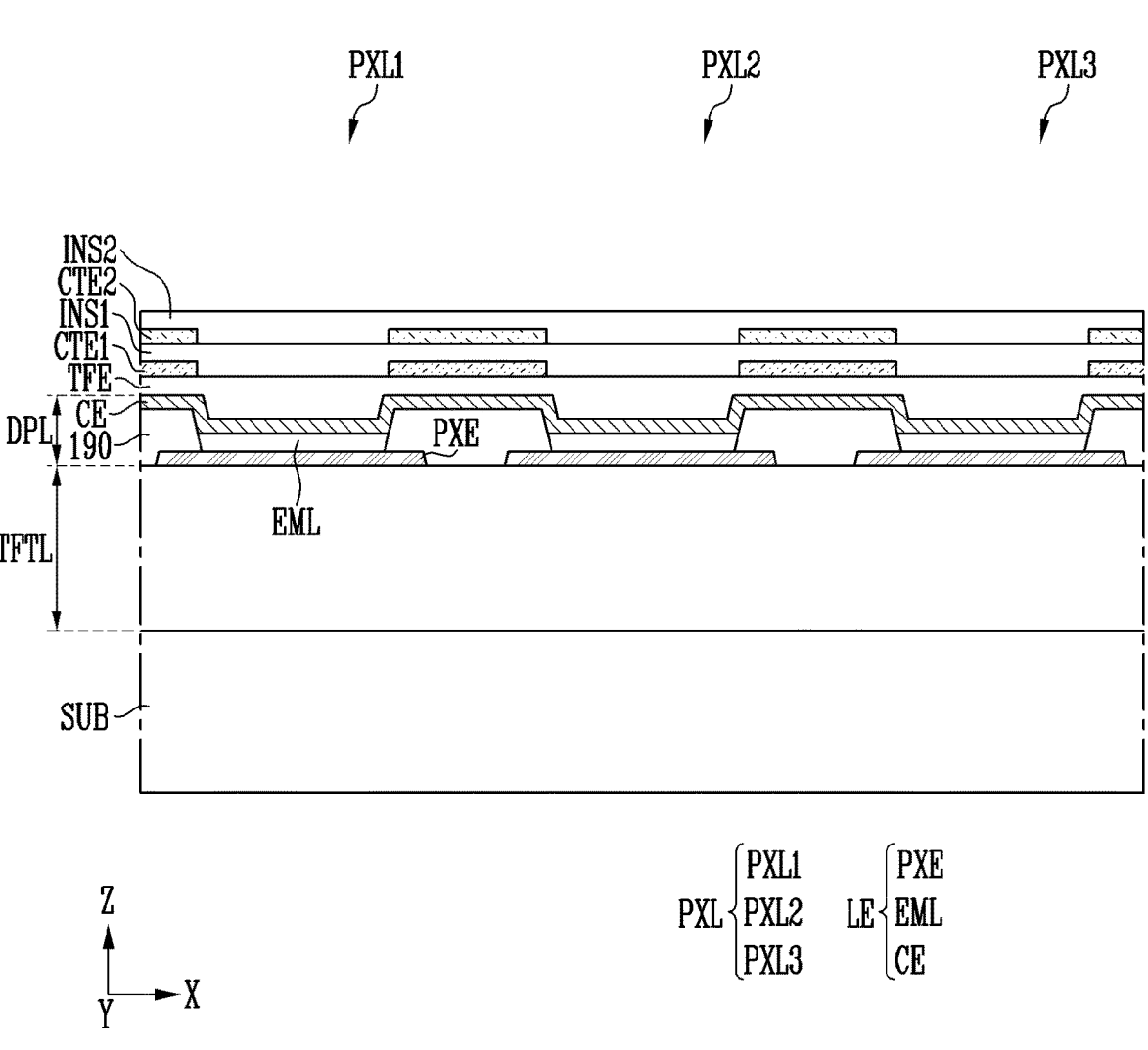

Referring to FIG. 10, the second insulating layer INS2 may be formed on the second control electrodes CTE2. The second insulating layer INS2 may be directly disposed on the second control electrodes CTE2. The second insulating layer INS2 may be formed throughout the first to third pixels PXL1, PXL2, and PXL3.

Figure 11:
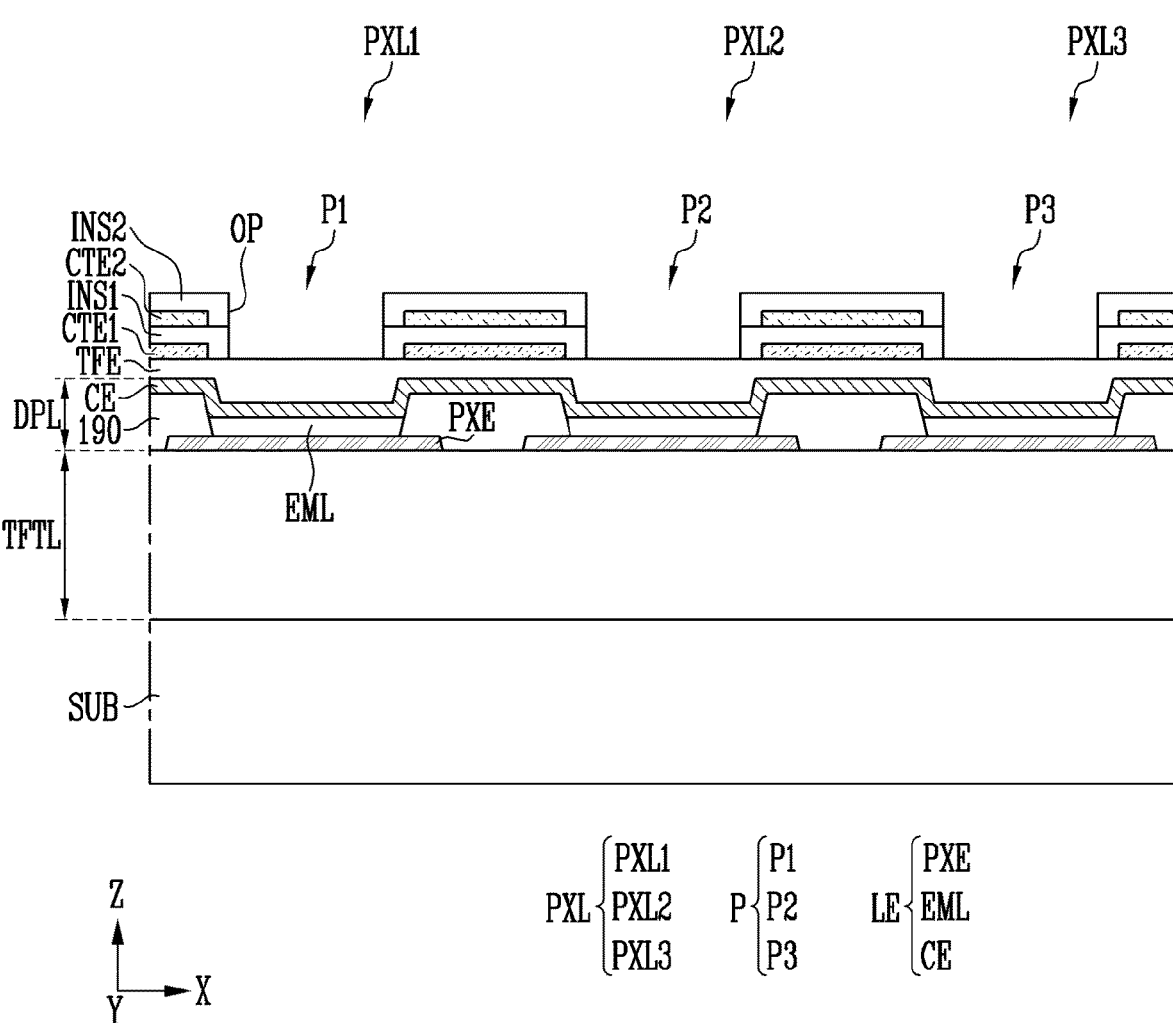

Referring to FIG. 11, the openings OP may be formed at the intersection P. The openings OP may be formed at the first to third intersections P1, P2, and P3, respectively. The openings OP may be formed in the first to third pixels PXL1, PXL2, and PXL3, respectively. The openings OP may overlap the light emitting element LE (or the emission layer EML) of the first to third pixels PXL1, PXL2, and PXL3. The openings OP may pass through the first insulating layer INS1 and the second insulating layer INS2 at the intersection P (or the pixels PXL) to provide a space in which the color conversion layer CCL may be provided. Since the intersection P is described in detail with reference to FIG. 3, an overlapping content is omitted.

Figure 12:
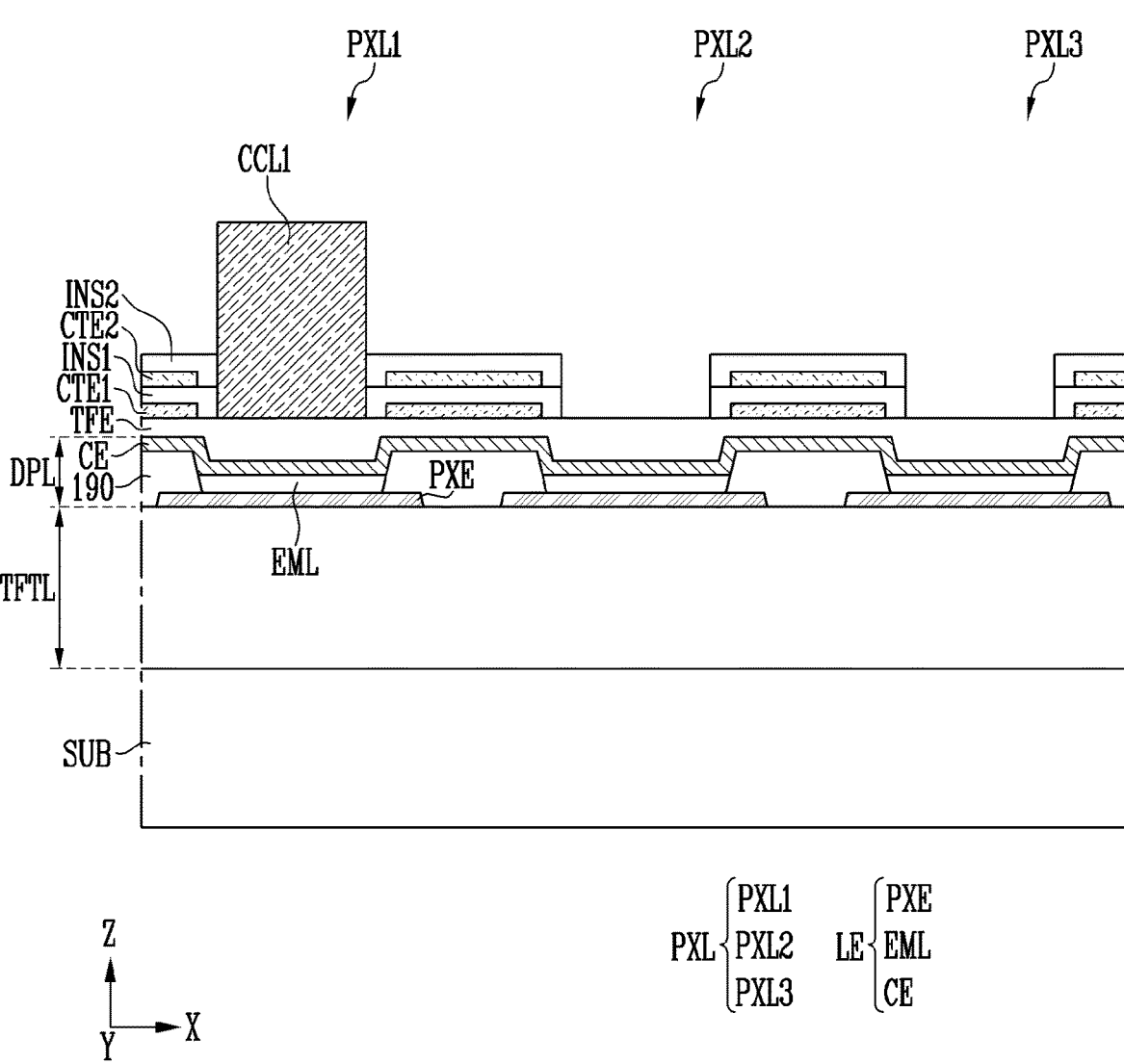

Referring to FIG. 12, the first color conversion layer CCL1 may be formed in the first pixel PXL1 (or the first intersection P1). For example, a solution in which a reactive mesogen (RM), a first quantum dot, and a solvent are mixed may be applied on the control electrodes CTE1 and CTE2, and ultraviolet rays may be irradiated under a non-uniform electric field. Accordingly, a first color conversion layer CCL1 particle including the first quantum dot may be formed by a photopolymerization reaction, and at the same time, the first color conversion layer CCL1 particle may be moved between the control electrodes CTE1 and CTE2 by the DEP to, for example, the first intersection P1 where a strong electric field is formed, to form the first color conversion layer CCL1 at the first intersection P1.

Figure 13:
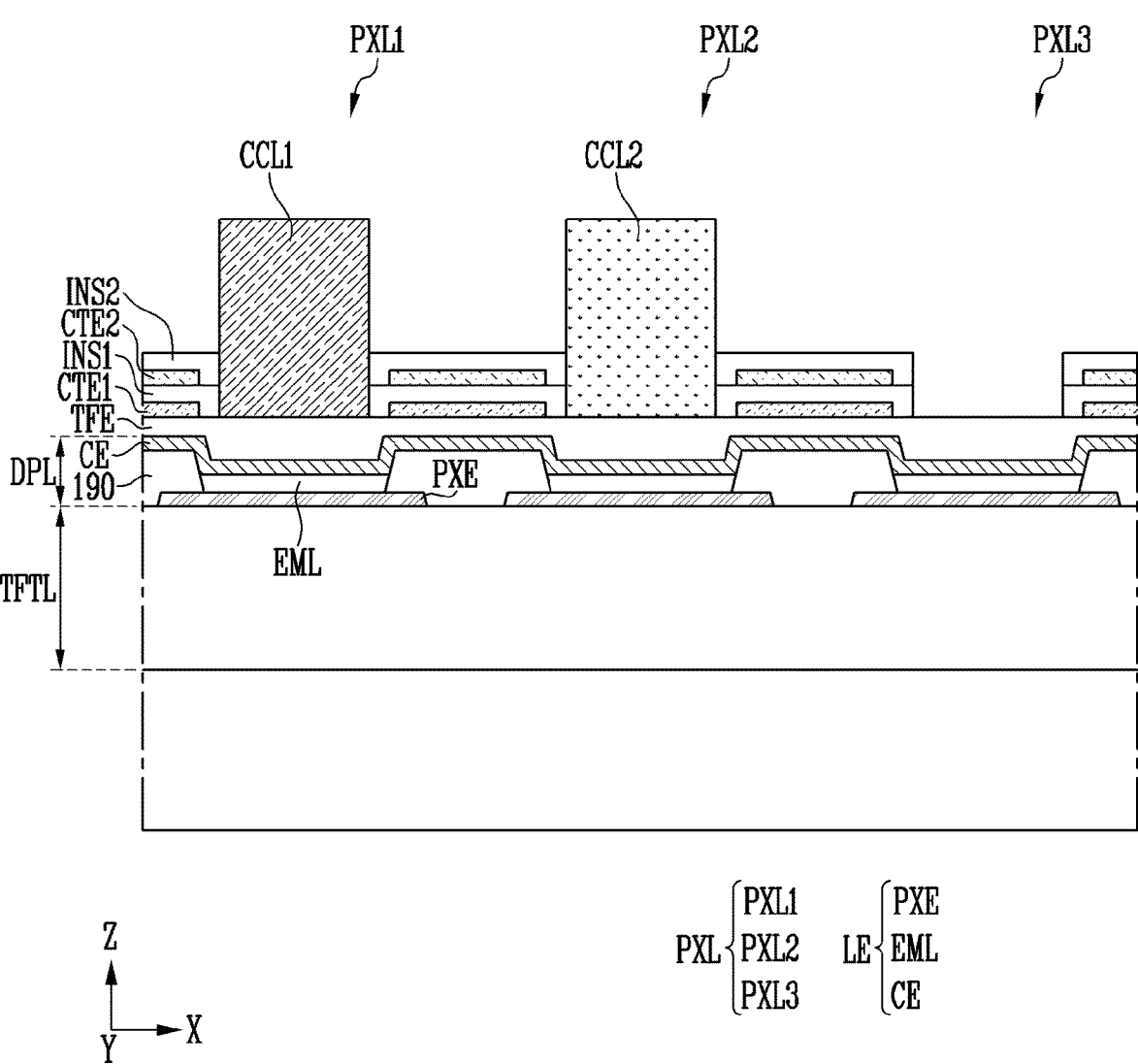

Referring to FIG. 13, the second color conversion layer CCL2 may be formed in the second pixel PXL2. For example, a solution in which a reactive mesogen (RM), a second quantum dot, and a solvent are mixed may be applied on the control electrodes CTE1 and CTE2, and ultraviolet rays may be irradiated under a non-uniform electric field. Accordingly, a second color conversion layer CCL2 particle including the second quantum dot may be formed by a photopolymerization reaction, and at the same time, the second color conversion layer CCL2 particle may be moved between the control electrodes CTE1 and CTE2 by the DEP to, for example, the second intersection P2 where a strong electric field is formed, to form the second color conversion layer CCL2 at the second intersection P2.

Figure 14:
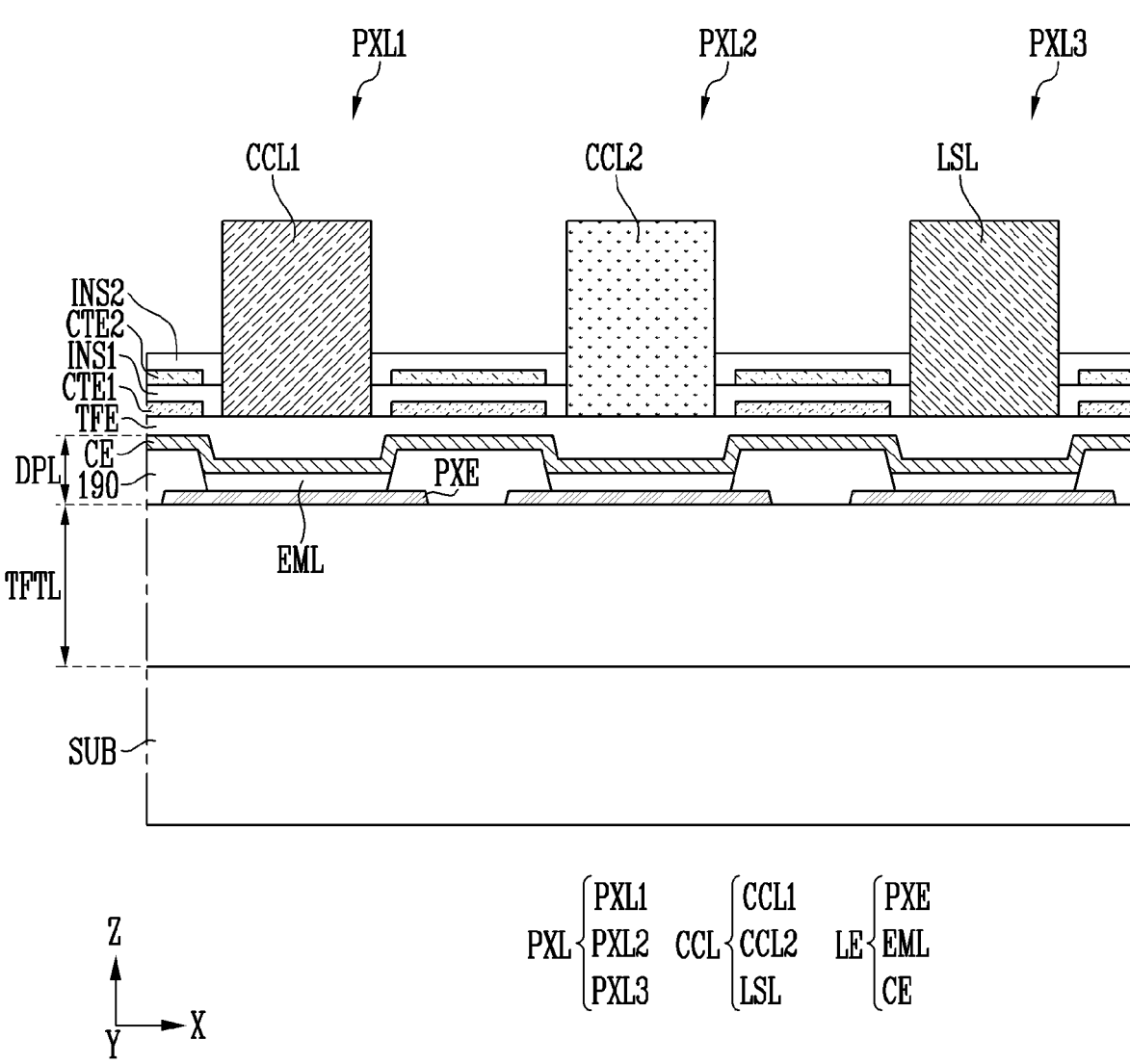

Referring to FIG. 14, the scattering layer LSL may be formed in the third pixel PXL3. The scattering layer LSL may be formed by an inkjet printing method, but is not limited thereto. Since the first color conversion layer CCL1, the second color conversion layer CCL2, and/or the scattering layer LSL are described in detail with reference to FIG. 2 and the like, an overlapping content is omitted.

Figure 15:
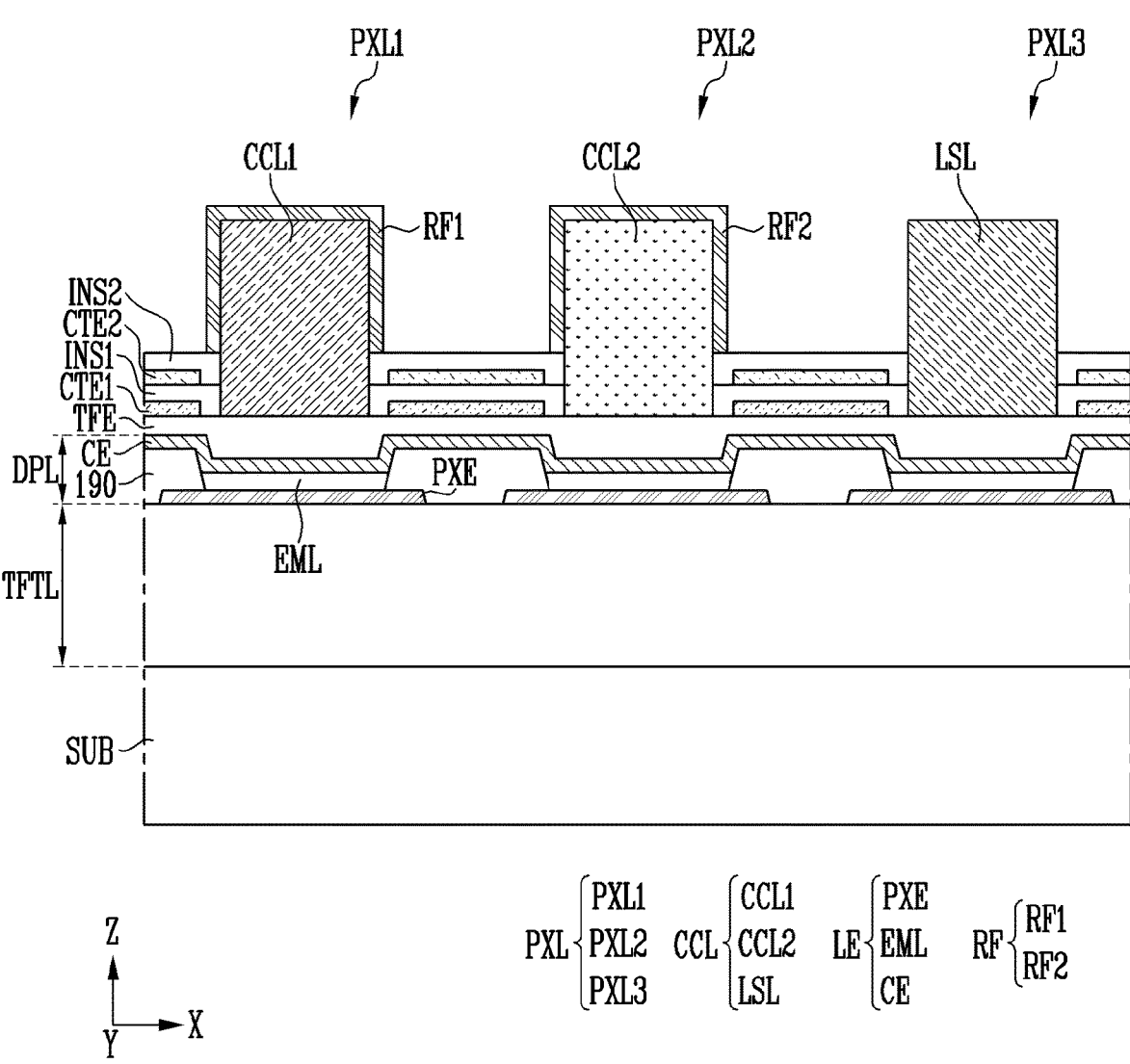

Referring to FIG. 15, the reflective layer RF may be formed on the first color conversion layer CCL1 and the second color conversion layer CCL2. The reflective layer RF may include the first reflective layer RF1 formed on the first color conversion layer CCL1 and the second reflective layer RF2 formed on the second color conversion layer CCL2. The first reflective layer RF1 and the second reflective layer RF2 may be separated from each other and formed on the first color conversion layer CCL1 and the second color conversion layer CCL2, respectively. The first reflective layer RF1 and the second reflective layer RF2 may be directly formed on the surface of the first color conversion layer CCL1 and the second color conversion layer CCL2, respectively. For example, the first reflective layer RF1 and the second reflective layer RF2 may include metallic nanoparticles formed by a photoreduction reaction on the surface of the first color conversion layer CCL1 and the second color conversion layer CCL2, respectively, but are not limited thereto. For example, each of the first reflective layer RF1 and the second reflective layer RF2 formed of metallic nanoparticles by a photoreduction reaction may be formed by applying a solution including a metal precursor on the surface of the first color conversion layer CCL1 and the second color conversion layer CCL2 and irradiating ultraviolet rays.

According to an embodiment, the first reflective layer RF1 and the second reflective layer RF2 may have a characteristic of selectively reflecting a specific wavelength. For example, the first reflective layer RF1 and the second reflective layer RF2 may reflect blue light and transmit red light or green light. Therefore, since the first reflective layer RF1 and the second reflective layer RF2 are formed on the side surface and the upper surface of the first color conversion layer CCL1 and the second color conversion layer CCL2, respectively, the light efficiency and the color reproducibility may be improved by transmitting each of the red light and the green light and recycling the blue light. In an embodiment, in case that the reflective layer RF has a reflective characteristic for blue light, the reflective layer RF may be omitted from the third pixel PXL3.

The display device of FIG. 2 may be completed by forming the capping layer CPL on the reflective layer RF.

Figure 16:
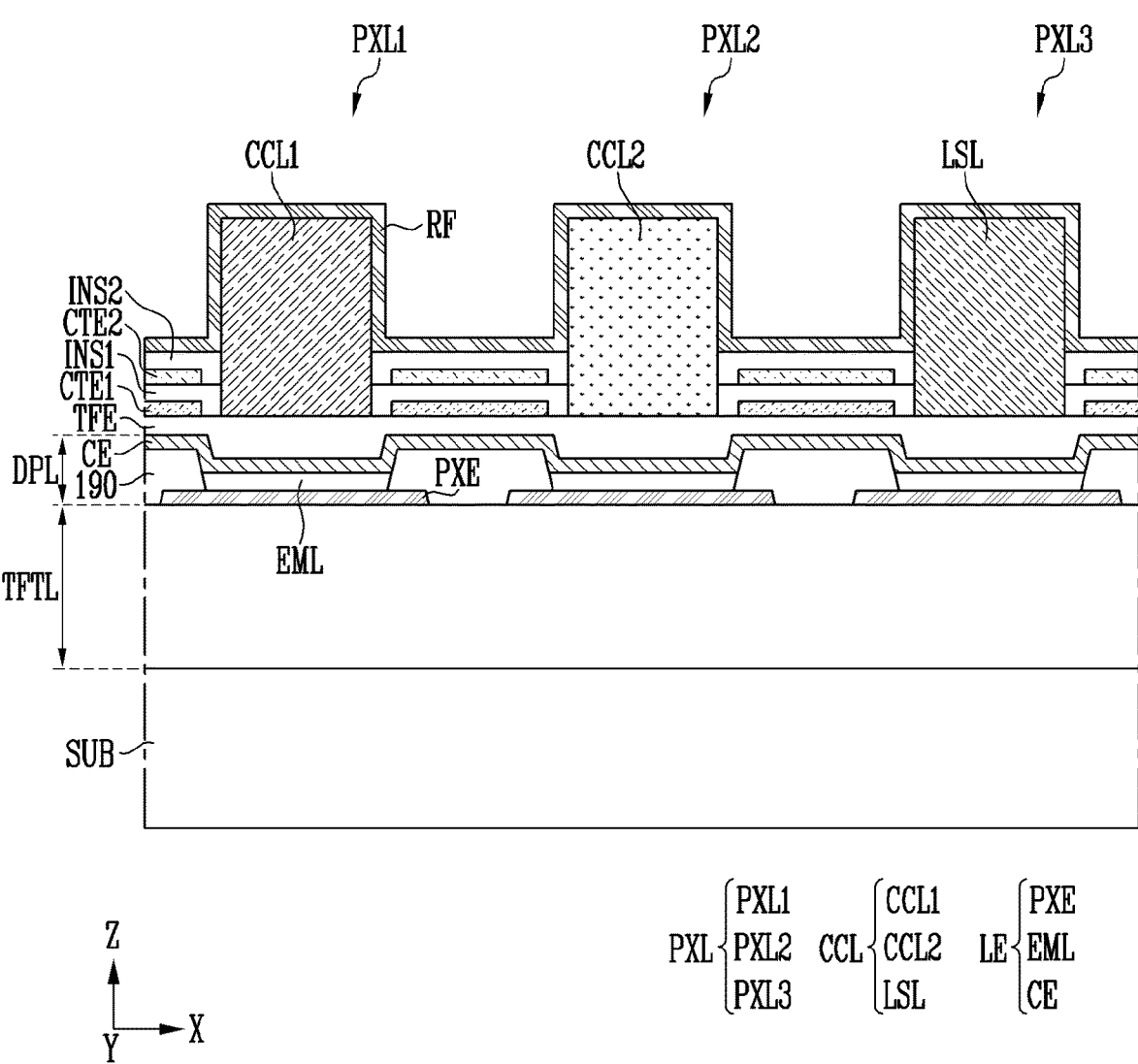
FIGS. 16 and 17 are schematic cross-sectional views for each process step illustrating a method of manufacturing a display device according to an embodiment.
Figure 17:
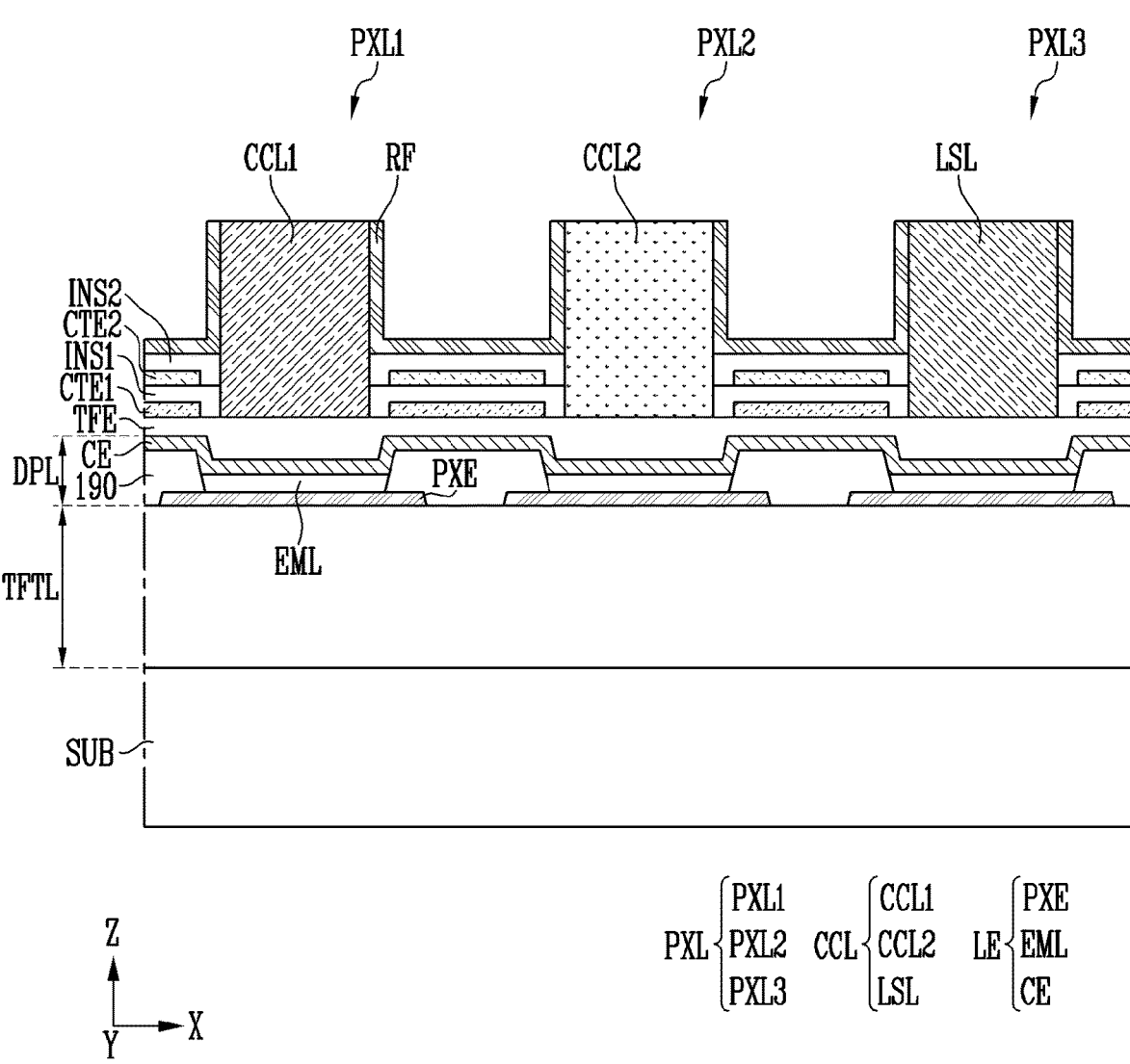

FIGS. 16 and 17 are schematic cross-sectional views for each process step illustrating a method of manufacturing a display device according to an embodiment. FIGS. 16 and 17 are schematic cross-sectional views illustrating a method of manufacturing the display device of FIG. 5, and for convenience of description, the figures are simplified, and detailed reference numerals are omitted.

Referring to FIG. 16, the reflective layer RF may be formed on the color conversion layer CCL. The reflective layer RF may be formed throughout the first to third pixels PXL1, PXL2, and PXL3. The material of the reflective layer RF is not particularly limited, and may include various reflective materials. The reflective layer RF may be formed by depositing a metal thin film on the color conversion layer CCL, but is not limited thereto. The reflective layer RF may be directly formed on the color conversion layer CCL. The reflective layer RF may be directly formed on the first color conversion layer CCL1, the second color conversion layer CCL2, and the scattering layer LSL.

Referring to FIG. 17, the reflective layer RF formed on the color conversion layer CCL may be etched. The reflective layer RF formed on the color conversion layer CCL may be partially removed to form the openings exposing the upper surface of the color conversion layer CCL and the scattering layer LSL. For example, the side surface of the first color conversion layer CCL1, the second color conversion layer CCL2, and the scattering layer LSL may be covered by the reflective layer RF and the upper surfaces of the first color conversion layer CCL1, the second color conversion layer CCL2, and the scattering layer LSL may be exposed through the openings of the reflective layer RF, respectively. The openings of the reflective layer RF may overlap the first to third pixels PXL1, PXL2, and PXL3 (or the first to third intersections P1, P2, and P3). The openings of the reflective layer RF may overlap the light emitting element LE (or the emission layer EML) of the first to third pixels PXL1, PXL2, and PXL3, respectively. Accordingly, the light emitted from the color conversion layer CCL may be emitted to the upper portion of the pixels PXL through the opening of the reflective layer RF.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device defining a thickness direction and comprising:

first control electrodes on a light emitting element layer;

second control electrodes on the first control electrodes;

an insulating layer between the first control electrodes and the second control electrodes; and a color conversion layer on the light emitting element layer, wherein a first space is disposed between the first control electrodes, a second space is disposed between the second control electrodes, and the color conversion layer is disposed at an intersection where the first space and the second space intersect, the color conversion layer overlaps the first control electrodes or the second control electrodes in a direction orthogonal to the thickness direction, and the color conversion layer is disposed in an opening passing through the insulating layer at the intersection.

2. The display device according to claim 1, wherein the first control electrodes extend in a first direction.

3. The display device according to claim 2, wherein the second control electrodes extend in a second direction intersecting the first direction.

4. The display device according to claim 1, wherein the first space extends in a first direction.

5. The display device according to claim 4, wherein the second space extends in a second direction intersecting the first direction.

6. The display device according to claim 1, further comprising:

a reflective layer on the color conversion layer.

7. The display device according to claim 1, wherein the light emitting element layer comprises:

a first electrode;

a second electrode disposed on the first electrode; and an emission layer between the first electrode and the second electrode.

8. The display device according to claim 7, wherein the intersection overlaps the emission layer in a plan view.

9. The display device according to claim 7, wherein the color conversion layer overlaps the emission layer in a plan view.

10. A display device defining a thickness direction and comprising:

first control electrodes extending in a first direction on a light emitting element layer;

second control electrodes extending in a second direction intersecting the first direction on the first control electrodes;

an insulating layer between the first control electrodes and the second control electrodes;

an intersection surrounded by the first control electrodes and the second control electrodes in a plan view;

a color conversion layer disposed at the intersection; and a reflective layer on the color conversion layer, wherein the color conversion layer overlaps the first control electrodes or the second control electrodes in a direction orthogonal to the thickness direction, and the color conversion layer is disposed in an opening passing through the insulating layer at the intersection.

11. The display device according to claim 10, wherein the intersection includes a first intersection, a second intersection, and a third intersection.

12. The display device according to claim 11, wherein the color conversion layer comprises:

a first color conversion layer disposed at the first intersection;

a second color conversion layer disposed at the second intersection; and a scattering layer disposed at the third intersection.

13. The display device according to claim 12, wherein the reflective layer is directly disposed on the first color conversion layer, the second color conversion layer, and the scattering layer.

14. The display device according to claim 12, wherein the reflective layer comprises:

a first reflective layer on the first color conversion layer; and a second reflective layer on the second color conversion layer.

15. The display device according to claim 14, wherein the first reflective layer and the second reflective layer are offset from the scattering layer in a plan view.

16. The display device according to claim 14, wherein the first reflective layer and the second reflective layer are separated from each other.

17. The display device according to claim 12, wherein the reflective layer is directly disposed on a side surface of each of the first color conversion layer, the second color conversion layer, and the scattering layer.

18. The display device according to claim 17, wherein the reflective layer includes an opening exposing an upper surface of each of the first color conversion layer, the second color conversion layer, and the scattering layer.

19. The display device according to claim 18, wherein the opening overlaps the intersection in a plan view.

20. The display device according to claim 1, wherein the color conversion layer overlaps both the first control electrodes and the second control electrodes in the direction orthogonal to the thickness direction.

21. The display device according to claim 1, wherein the color conversion layer does not overlap the first control electrodes in the thickness direction.

22. The display device according to claim 1, wherein the color conversion layer does not overlap the second control electrodes in the thickness direction.

23. The display device according to claim 1, wherein the color conversion layer does not overlap the first control electrodes and the second control electrodes in the thickness direction.

24. The display device according to claim 10, wherein the color conversion layer overlaps both the first control electrodes and the second control electrodes in the direction orthogonal to the thickness direction.

25. The display device according to claim 10, wherein the color conversion layer does not overlap the first control electrodes in the thickness direction.

26. The display device according to claim 10, wherein the color conversion layer does not overlap the second control electrodes in the thickness direction.

27. The display device according to claim 10, wherein the color conversion layer does not overlap the first control electrodes and the second control electrodes in the thickness direction.

* * * * *